(12) United States Patent
Chakihara

(10) Patent No.: US 11,081,491 B2
(45) Date of Patent: Aug. 3, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventor: Hiraku Chakihara, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 19 days.

(21) Appl. No.: 16/374,320

(22) Filed: Apr. 3, 2019

(65) Prior Publication Data

US 2019/0326311 A1    Oct. 24, 2019

(30) Foreign Application Priority Data

Apr. 20, 2018  (JP) .............................. JP2018-081759

(51) Int. Cl.

| | | |
|---|---|---|
| H01L 23/52 | (2006.01) | |
| H01L 27/11565 | (2017.01) | |
| H01L 29/06 | (2006.01) | |
| H01L 29/423 | (2006.01) | |
| H01L 29/66 | (2006.01) | |
| H01L 29/78 | (2006.01) | |
| H01L 21/66 | (2006.01) | |
| H01L 23/522 | (2006.01) | |
| H01L 21/28 | (2006.01) | |

(52) U.S. Cl.
CPC ........ *H01L 27/11565* (2013.01); *H01L 22/12* (2013.01); *H01L 22/14* (2013.01); *H01L 23/5223* (2013.01); *H01L 29/0649* (2013.01); *H01L 29/40117* (2019.08); *H01L 29/42344* (2013.01); *H01L 29/66545* (2013.01); *H01L 29/7851* (2013.01)

(58) Field of Classification Search
CPC .......... H01L 27/11565; H01L 29/0649; H01L 29/42344; H01L 22/12; H01L 22/14; H01L 23/5223
See application file for complete search history.

(56) References Cited

U.S. PATENT DOCUMENTS

2014/0346581 A1* 11/2014 Ishii ................. H01L 21/76895
                                                       257/298

FOREIGN PATENT DOCUMENTS

JP        2014-078661 A      5/2014

* cited by examiner

*Primary Examiner* — Fernando L Toledo
*Assistant Examiner* — Valerie N Newton
(74) *Attorney, Agent, or Firm* — McDermott Will & Emery LLP

(57) ABSTRACT

There is provided a semiconductor device including a first gate pattern on a semiconductor substrate, a second gate pattern adjacent to a side surface of the first gate pattern via an ONO film, and an active region located just below the second gate pattern via the ONO film. Here, an element isolation region is formed just below the first gate pattern. In this manner, capacitance between the first gate pattern and the semiconductor substrate and capacitance between the first and second gate patterns are prevented from being measured when measuring capacitance between the second gate pattern which is an upper electrode and the active region which is a lower electrode in order to measure a film thickness of the ONO film just below the second gate pattern.

5 Claims, 32 Drawing Sheets

| OPERATIONS / APPLIED VOLTAGE | Vd | Vcg | Vmg | Vs | Vb |
|---|---|---|---|---|---|
| WRITE | Vdd | 1V | 12V | 6V | 0 |
| ERASE | 0 | 0 | −6V | 6V | 0 |
| READ | Vdd | Vdd | 0 | 0 | 0 |

Vdd = 1.5V

SEMICONDUCTOR DEVICE AND METHOD OF MANUFACTURING THE SAME

CROSS-REFERENCE TO RELATED APPLICATION

The present application claims priority from Japanese Patent Application No. 2018-81759 filed on Apr. 20, 2018, the content of which is hereby incorporated by reference into this application.

TECHNICAL FIELD OF THE INVENTION

The present invention relates to a semiconductor device and a manufacturing method thereof, and particularly relates to a technique effectively applied to a semiconductor device comprising a capacitor element constituted by an electrode and a substrate, and a manufacturing method of this semiconductor device including a step of measuring electrostatic capacitance of the capacitor element to measure a film thickness of an insulating film between the electrode and the substrate.

BACKGROUND OF THE INVENTION

A known example of a nonvolatile memory includes a MONOS (metal-oxide-nitride-oxide semiconductor) memory having a FET (Field Effect Transistor) structure and being configured to accumulate charge in an ONO (oxide-nitride-oxide) film formed between a gate electrode and a substrate in order to store information. In addition, an example of the MONOS memory includes a split-gate type nonvolatile memory having a control (selection) gate electrode used for selecting a memory cell and a memory gate electrode used for storing information and being formed to be adjacent to the control gate electrode via an insulating film.

In a manufacturing process of the nonvolatile memory, a film thickness of the ONO film formed is occasionally measured in order to enhance reliability of the memory. As a method of measuring the film thickness of the ONO film, there is a method in which capacitance between an electrode (gate pattern) on the ONO film and a semiconductor layer (such as a substrate or a gate pattern) below the ONO film is measured and the film thickness is calculated based on the measurement result.

In addition, as a method of reducing gate resistance of the field effect transistor and controlling threshold voltage, there is a known manufacturing method (gate-last process) in which a dummy gate electrode and source/drain regions are formed, and then, the dummy gate electrode is replaced with a metal film (metal gate electrode).

Patent Document 1 (Japanese Patent Application Laid-Open Publication No. 2014-78661) discloses a process of forming a nonvolatile memory device constituted by two MOSFETs (Metal Oxide Semiconductor Field Effect Transistors) arranged side-by-side on a semiconductor substrate and forming a capacitor element in another region. The capacitor element is an element including two electrodes adjacent to each other on the substrate, one of the two electrodes being an electrode formed on an active region of the semiconductor substrate via an ONO film, and the other of the two electrodes being an electrode formed on the active region with an insulating film that differs from the ONO film interposed therebetween.

SUMMARY OF THE INVENTION

In a gate-last process, an upper surface of a dummy gate electrode covered by an interlayer insulating film is exposed by the polishing method, and then, the dummy gate electrode is replaced with a metal gate electrode. In a case where this polishing process is performed, a structure in which a gate electrode overlaps another gate electrode would not be able to remain on a substrate. Therefore, a film thickness of an ONO film cannot be measured by using a capacitor element having the structure in which a gate pattern is formed on another gate pattern via the ONO film.

In addition, in a case where a sidewall spacer-like memory gate electrode made of a semiconductor film is formed beside a control gate electrode in a self-aligning manner, a mask for patterning the memory gate electrode can be omitted. However, since patterning with using a mask cannot be performed, a gate pattern made of the semiconductor film cannot be formed independently on the semiconductor substrate via the ONO film. Thus, as a method of measuring the film thickness of the ONO film, one can consider a method of measuring capacitance between a second gate pattern beside a first gate pattern via the ONO film and the semiconductor substrate located just below the second gate pattern via the ONO film. However, since capacitance between the semiconductor substrate and the first gate pattern and capacitance between the first gate pattern and the second gate pattern would also be measured when measuring capacitance between the second gate pattern and the semiconductor substrate, there is a problem in that the film thickness of the ONO film cannot be accurately measured.

Other objects and novel features will be apparent from the description in the present specification and the attached drawings.

The following is a brief overview of a representative embodiment disclosed in the present application.

A semiconductor device according to one embodiment of the present invention is a semiconductor device having an element isolation region buried in an upper surface of a semiconductor substrate, a first gate pattern formed on the element isolation region, and a second gate pattern adjacent to a side surface of the first gate pattern via an insulating film and being located just above an active region of the semiconductor substrate via the insulating film.

In addition, a manufacturing method of a semiconductor device according to another embodiment of the present invention is a manufacturing method in which the element isolation region buried in the upper surface of the semiconductor substrate, the first gate pattern formed on the element isolation region, and the second gate pattern adjacent to the side surface of the first gate pattern via the insulating film and being located just above the active region of the semiconductor substrate via the insulating film are formed.

According to one embodiment disclosed in the present application, reliability of the semiconductor device can be improved.

DESCRIPTION OF THE PREFERRED EMBODIMENTS

Figure 1:
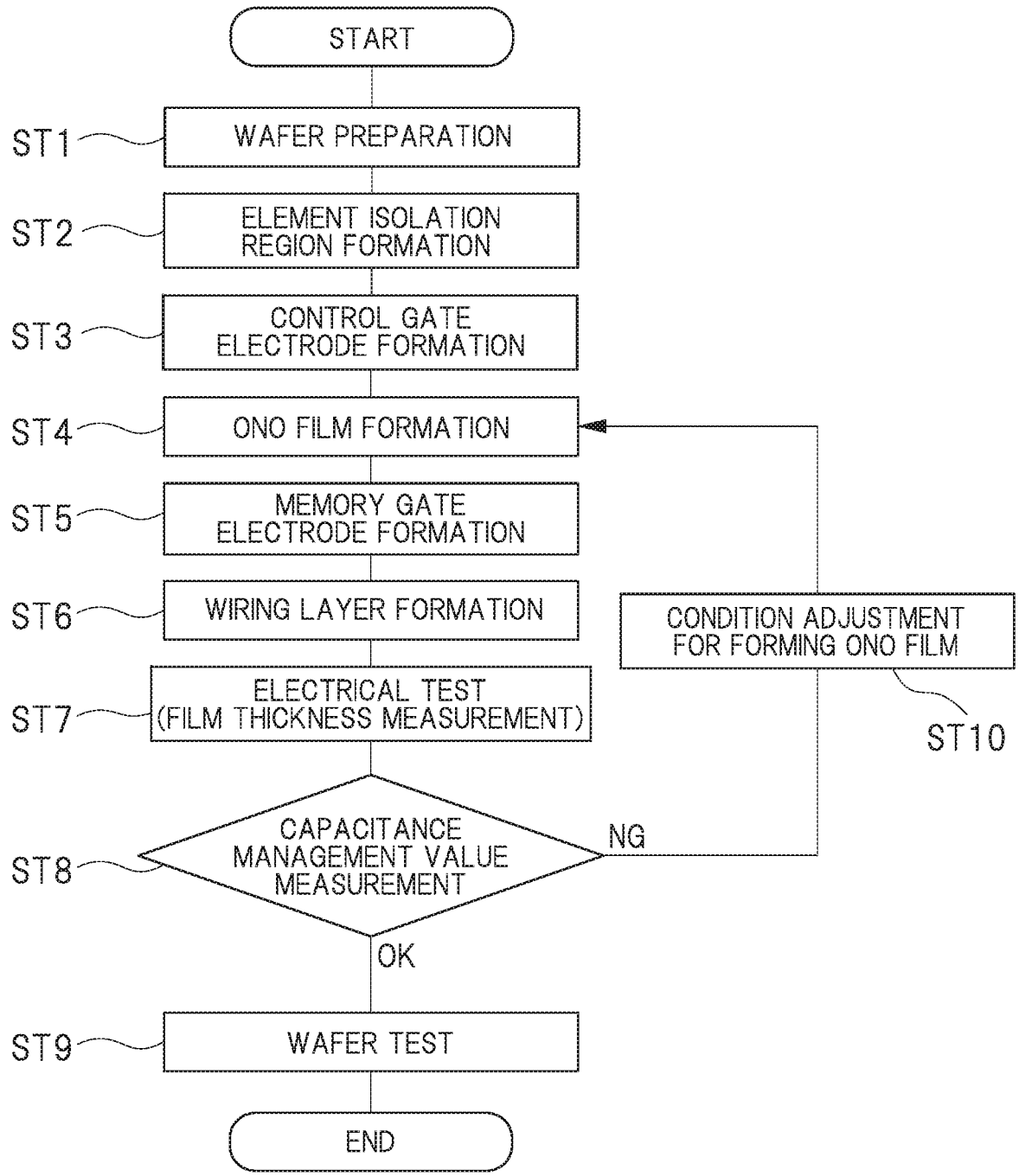
FIG. 1 is a flowchart describing a manufacturing process of a semiconductor device according to a first embodiment of the present invention.

In the embodiments described below, the invention will be described in a plurality of sections or embodiments if necessary for the sake of convenience. However, these sections or embodiments are not irrelevant to each other unless otherwise clearly specified, and one section or embodiment partially or entirely corresponds to another section or embodiment as a modification example, detailed or supplementary description or the like. In addition, in the embodiments described below, when referring to the number of a component (including number of pieces, numerical value, amount and range), the number is not limited to a specified number and may be less than or greater than this number unless otherwise clearly specified or unless it is obvious from the context that the number is limited to the specified number in principle.

Furthermore, in the embodiments described below, it goes without saying that each component (including an element step) is not indispensable unless otherwise clearly specified or unless it is obvious from the context that the component is indispensable in principle. Likewise, in the embodiments described below, when referring to a shape, a positional relation or the like of a component, a substantially approximate shape, a similar shape or the like is included unless otherwise clearly specified or unless it is obvious from the context that the shape, the positional relation or the like of the component differs in principle. The same applies to the above-described numerical value and range.

Hereinafter, embodiments of the present invention will be described in detail with reference to the drawings. Note that, in all of the drawings used to describe the embodiments, the same members are generally denoted by the same reference signs, and redundant descriptions thereof are omitted as appropriate. In addition, in the embodiments described below, descriptions of the same or similar portions are generally not repeated unless otherwise necessary. Further, in the drawings used to describe the embodiment, hatched lines are occasionally added in order to easily view the configuration thereof even if the drawing is a plan view, a perspective view or the like.

First Embodiment

A semiconductor device of a first embodiment is a semiconductor device in which a capacitor element for measuring a film thickness of an ONO film and an element isolation region are formed. The capacitor element comprises a second electrode formed on a semiconductor substrate via the ONO film and being adjacent to a side surface of a first electrode, and an active region below the second electrode. The element isolation region is formed below the first electrode. Here, a method of preventing a decrease in accuracy of film thickness measurement, which is caused by capacitance between the first electrode and the second electrode or the like being unnecessarily measured when measuring capacitance between the second electrode and the semiconductor substrate just below the second electrode in order to measure the film thickness of the ONO film, will be described.

Figure 2:
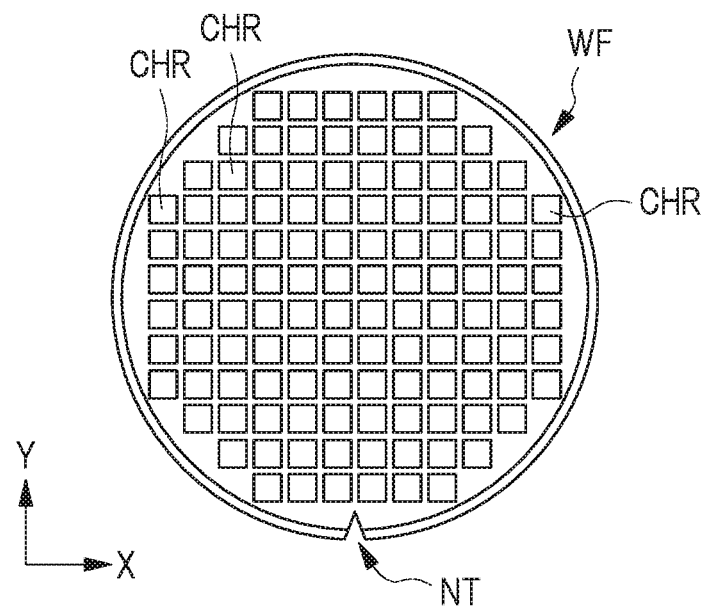
FIG. 2 is a plan view of the semiconductor device according to the first embodiment of the present invention in the manufacturing process.
Figure 3:
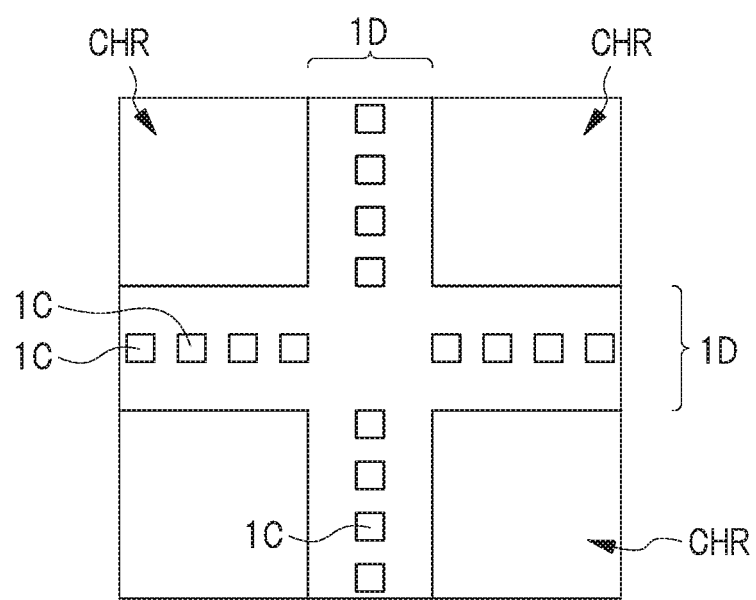
FIG. 3 is a plan view of the semiconductor device according to the first embodiment of the present invention in the manufacturing process.

Hereinafter, a manufacturing process of the present embodiment will be described with reference to FIGS. 2 to 16 according to the flowchart of the manufacturing process shown in FIG. 1. FIG. 1 is a flowchart describing the manufacturing process of the semiconductor device of the present embodiment. FIGS. 2 and 3 are plan views of the semiconductor device of the present embodiment in the manufacturing process, and FIGS. 4 to 11 and FIGS. 13 to 15 are cross-sectional views of the semiconductor device of the present embodiment in the manufacturing process. FIGS. 12 and 16 are plan views of the semiconductor device of the present embodiment in the manufacturing process. FIGS. 4 to 11 and FIGS. 13 to 15 show cross sections of a logic circuit region 1A, a memory cell region 1B and a TEG region (test element forming region, capacitor element forming region) 1C arranged in this order from left to right.

First, as shown in FIGS. 2 and 3, a semiconductor wafer WF (semiconductor substrate SB shown in FIG. 4) is prepared (step ST1 of FIG. 1). The semiconductor wafer WF is a p-type substrate made of, for example, single crystal silicon (Si), and has a main surface which is a first surface on a side on which a semiconductor element such as a transistor is formed and a back surface (rear surface) which is a second surface opposite to the first surface.

The semiconductor wafer WF (semiconductor substrate SB) having a circular shape in plan view has an end portion partially provided with a notch NT. In addition, the semiconductor wafer WF has a plurality of chip regions CHR arranged side-by-side in a matrix-like manner in plan view. Namely, the plurality of chip regions CHR are arranged side-by-side in an array-like (matrix-like) manner in an X direction and a Y direction. The X direction and the Y direction are directions orthogonal to each other in plan view, and are directions along the main surface of the semiconductor wafer (semiconductor substrate) WF. Each of the chip regions CHR has a rectangular shape in plan view.

The plurality of chip regions CHR arranged side-by-side on an upper surface of the semiconductor wafer WF are spaced apart from one another. A region between the chip regions CHR adjacent to each other is a scribe region (scribe line) 1D. Each of the chip regions CHR is surrounded by the scribe region 1D. In addition, the scribe region 1D extends in the X direction and the Y direction. The scribe region 1D is a region in which a portion thereof is cut along an extending direction of the scribe region 1D. In other words, the scribe region 1D is a region in which a portion thereof is removed to separate each of the chip regions CHR. Each of the chip regions CHR singulated by cutting becomes a semiconductor chip CHP (see FIG. 16). In other words, the chip region CHR is a region that becomes a single semiconductor chip after a dicing process. In FIG. 3, four chip regions CHR arranged side-by-side are shown enlarged. The scribe region 1D has a plurality of TEG (Test Elemental Group) regions 1C which are regions in which test elements are formed. The TEG regions 1C are regions in which elements for measuring a film thickness of a film formed on the semiconductor wafer WF are formed, or are regions in which elements, circuits or the like for confirming operations of elements, circuits or the like formed on the semiconductor wafer WF are formed. A test using the TEG is performed after an element, a stacked wiring layer and a pad are formed on the semiconductor wafer WF but before a cutting process, and is electrically performed by bringing, for example, a probe needle into contact with the pad. The TEG regions 1C are arranged at a center portion of a shorter direction of the scribe region 1D, and are arranged side-by-side in one row in the extending direction of the scribe region 1D. FIG. 3 shows a case where only one row of TEG regions 1C is formed between the chip regions CHR adjacent to each other. However, in a case where a width of the scribe region 1D in the shorter direction is large, two or more rows of TEG regions 1C can be formed between the chip regions CHR adjacent to each other.

Hereinafter, details of cross-sectional structures of the logic circuit region 1A and the memory cell region 1B inside the chip region CHR and the TEG region 1C outside the chip region CHR in the manufacturing process will be described with reference to FIGS. 4 to 11 and FIGS. 13 to 15.

Figure 4:
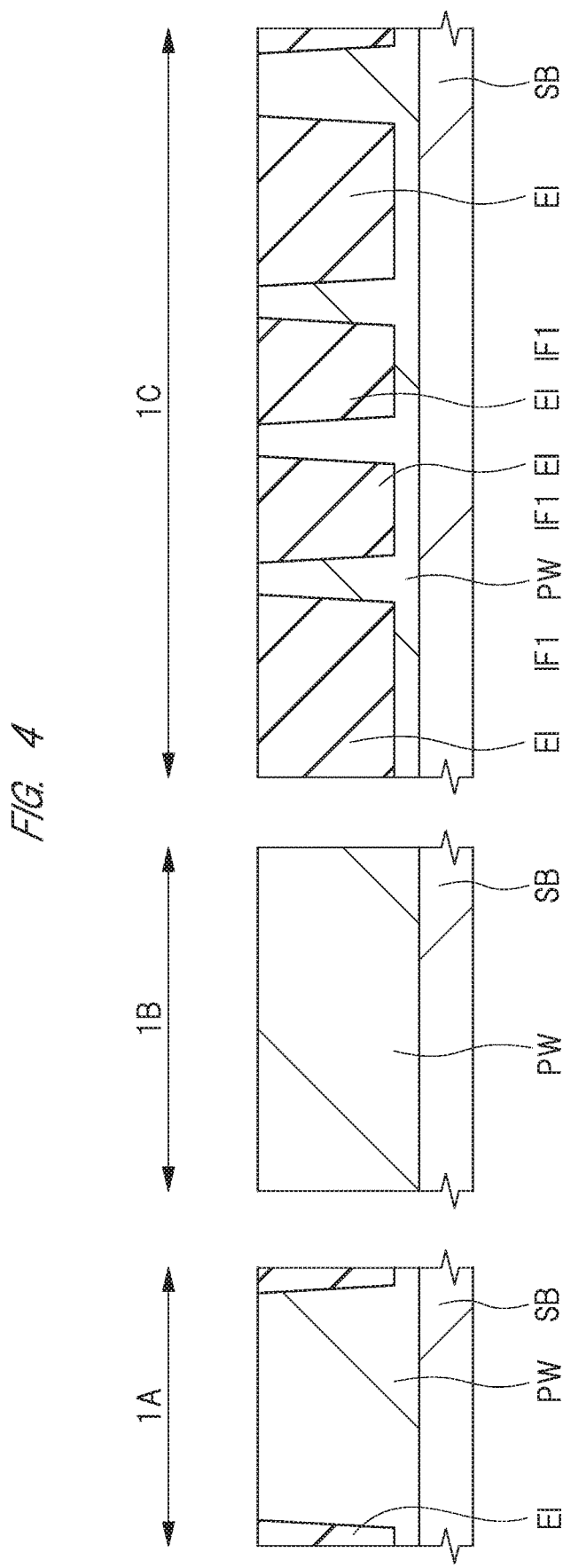
FIG. 4 is a cross-sectional view of the semiconductor device according to the first embodiment of the present invention in the manufacturing process.

As shown in FIG. 4, after a trench is formed in the main surface of the semiconductor substrate SB by using the photolithography technique and the etching method, a silicon oxide film or the like is buried in the trench to form an element isolation region (element isolation film) EI (step ST2 of FIG. 1). The semiconductor substrate SB having an upper surface exposed from the element isolation regions EI is an active region. In other words, a layout of the active region is defined by the element isolation region EI. Thus, the active region and the element isolation region EI are adjacent to each other. FIG. 4 does not show the element isolation region EI in the memory cell region 1B. However, in practice, the element isolation region EI is formed in the memory cell region 1B as in the case of the logic circuit region 1A.

In the TEG region 1C, the plurality of element isolation regions EI each extending in, for example, the Y direction (see FIG. 2) are formed side-by-side in the X direction (see FIG. 2). That is, stripe-like element isolation regions EI are formed. In other words, the element isolation region EI extending in the Y direction and the active region extending in the Y direction are alternately arranged side-by-side in the X direction. Each of the active regions is surrounded by the element isolation region EI in plan view (see FIG. 12). The TEG region 1C of FIG. 4 shows a cross section of each of the stripe-like element isolation regions EI extending in the Y direction. Namely, the TEG region 1C of FIG. 4 shows a cross section along, for example, the X direction.

The element isolation region is, for example, an STI (Shallow Trench Isolation) region, and is an insulating region formed for electrically insulating and isolating each of the semiconductor elements on the semiconductor substrate SB. In addition, some of the element isolation regions EI formed in the TEG region 1C play a role in preventing occurrence of capacitance between the semiconductor substrate SB and a control gate electrode formed on the element isolation region EI in subsequent steps.

Thereafter, impurities are implanted into the main surface of the semiconductor substrate SB by the ion implantation method or the like to form a well PW extending from the main surface of the semiconductor substrate SB in each of the logic circuit region 1A, memory cell region 1B and TEG region 1C to an intermediate depth of the semiconductor substrate SB. The well (semiconductor region) PW is formed to be deeper than, for example, the element isolation region EI. At this time, p-type impurities (such as B (boron)) are implanted into the upper surface of the semiconductor substrate SB in the logic circuit region 1A and the memory cell region 1B to form a p-type well PW, and n-type impurities (such as As (arsenic)) are implanted into the upper surface of the semiconductor substrate SB in the TEG region 1C to form an n-type well PW. In addition, n-type impurities (such as As (arsenic)) are implanted into the upper surface of the semiconductor substrate SB in another region (not shown) of the logic circuit region 1A to form an n-type well PW. Such implantation of impurities are separately performed by using a photo resist film formed by the photolithography technique as a mask.

Figure 5:
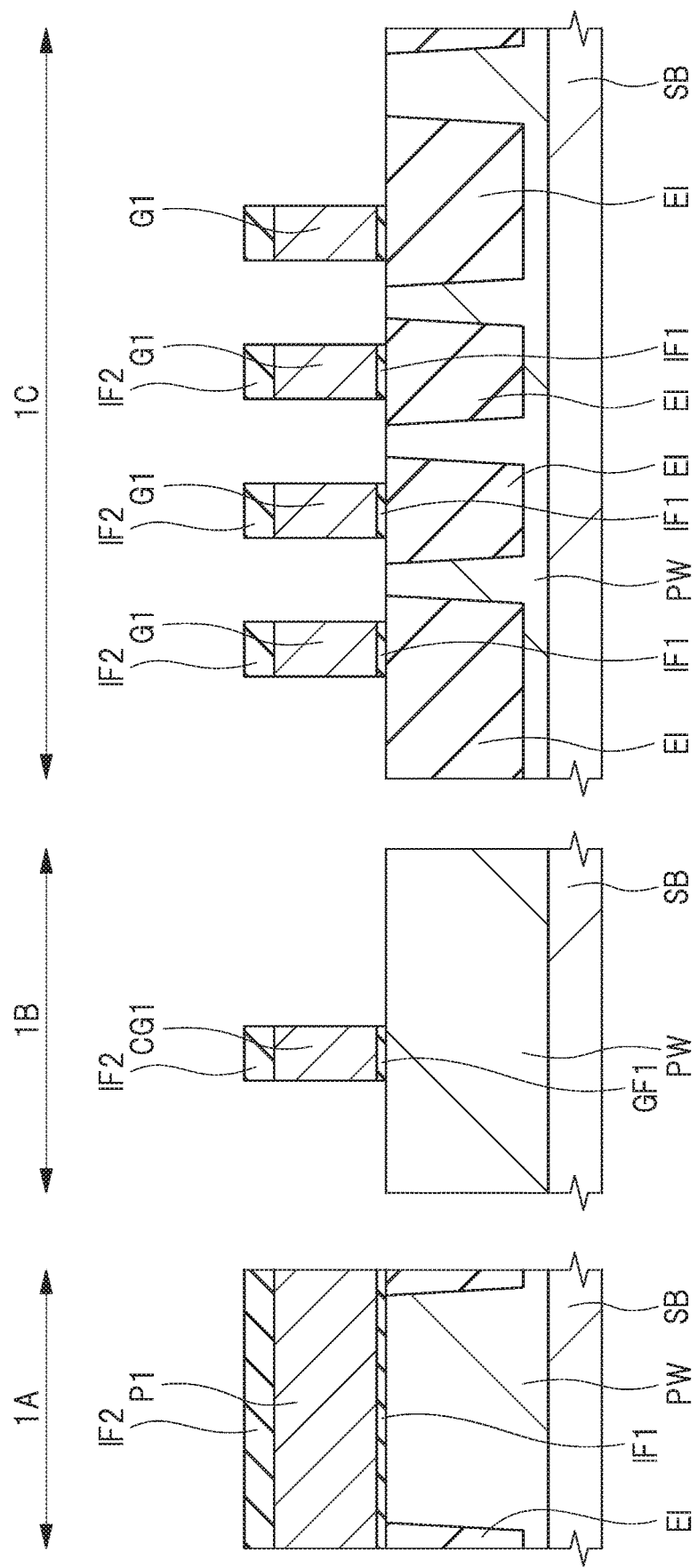
FIG. 5 is a cross-sectional view of the semiconductor device in the manufacturing process continued from FIG. 4.

Next, as shown in FIG. 5, a control gate electrode CG1 and a gate pattern (gate electrode) G1 are formed (step ST3 of FIG. 1). Namely, an insulating film IF1 and a polysilicon film P1 are sequentially formed on the main surface of the semiconductor substrate SB. The insulating film IF1 is made of, for example, a silicon oxide film, and the insulating film IF1 and the polysilicon film P1 are formed by, for example, the CVD (Chemical Vapor Deposition) method. N-type impurities (such as As (arsenic)) are implanted into a portion of the polysilicon film P1. Subsequently, an insulating film IF2 is formed on the polysilicon film P1 by using, for example, the CVD method. The insulating film IF2 is made of, for example, a silicon nitride film. Note that a thin silicon oxide film may be formed between the polysilicon film P1 and the insulating film IF2.

Next, after a pattern of the photo resist film is formed on the insulating film IF2 by the photolithography technique, the insulating film IF2 is processed (patterned) by the dry etching method using the photo resist film as a mask to expose a portion of an upper surface of the polysilicon film P1. Here, the entire polysilicon film P1 is exposed in the logic circuit region 1A, whereas a portion of the polysilicon film P1 is exposed in the memory cell region 1B. In addition, the insulating film IF2 remains in the TEG region 1C in a region overlapping an upper surface of the element isolation region EI in plan view. Namely, the insulating film IF2 having a comb-like layout including the stripe-like pattern is formed in the TEG region 1C. The insulating film IF2 is a film used as a hard mask to prevent etching thereof.

Subsequently, after the photo resist film is removed, a photo resist pattern covering the logic circuit region 1A is formed. Thereafter, dry-etching is performed with using the photo resist pattern and the insulating film IF2 as a mask. By removing portions of the polysilicon film P1 and insulating film IF1 in this manner, the upper surface of the semiconductor substrate SB is exposed.

The control gate electrode CG1 made of the polysilicon film P1 and a gate insulating film GF1 made of the insulating film IF1 are formed in the memory cell region 1B by the etching process. The insulating film IF2 remains on the control gate electrode CG1 as a cap film. A pattern of a stacked film constituted by the gate insulating film GF1, the control gate electrode CG1 and the insulating film IF2 extends in the Y direction (direction perpendicular to the drawing plane of FIG. 5). In addition, processing the insulating film IF2, the polysilicon film P1 and the insulating film IF1 in the etching process allows a plurality of gate patterns G1 made of the polysilicon film P1 and extending in the Y direction (direction perpendicular to the drawing plane of FIG. 5) to be formed on the semiconductor substrate SB in the TEG region 1C to be side-by-side in the X direction. The insulating films IF1 and IF2 in the TEG region 1C have the same layout as the gate pattern G1 in plan view.

In the TEG region 1C, the gate pattern G1 is formed just above the stripe-like element isolation regions EI extending in the Y direction (see FIG. 12). In other words, the entire gate pattern G1 is formed only at a position overlapping the element isolation regions EI in plan view. Thus, in the TEG region 1C, no gate pattern G1 is formed just above the semiconductor substrate SB between the element isolation regions EI adjacent to each other in the X direction. The gate pattern G1 and the active region (the upper surface of the semiconductor substrate SB exposed from the element isolation regions EI) are spaced apart from each other in plan view. A distance between the gate pattern G1 and the active region in plan view is greater than or equal to the film thickness of, for example, the ONO film formed on a side surface of the gate pattern G1 in a step described below with reference to FIG. 6. In addition, one of the end portions in the Y direction (an extending direction of the gate pattern G1) of each of the stripe-like gate patterns G1 extending in the Y direction is connected to a single gate pattern G1 extending in the X direction. In other words, the gate pattern G1 has a comb-like shape in plan view.

Figure 6:
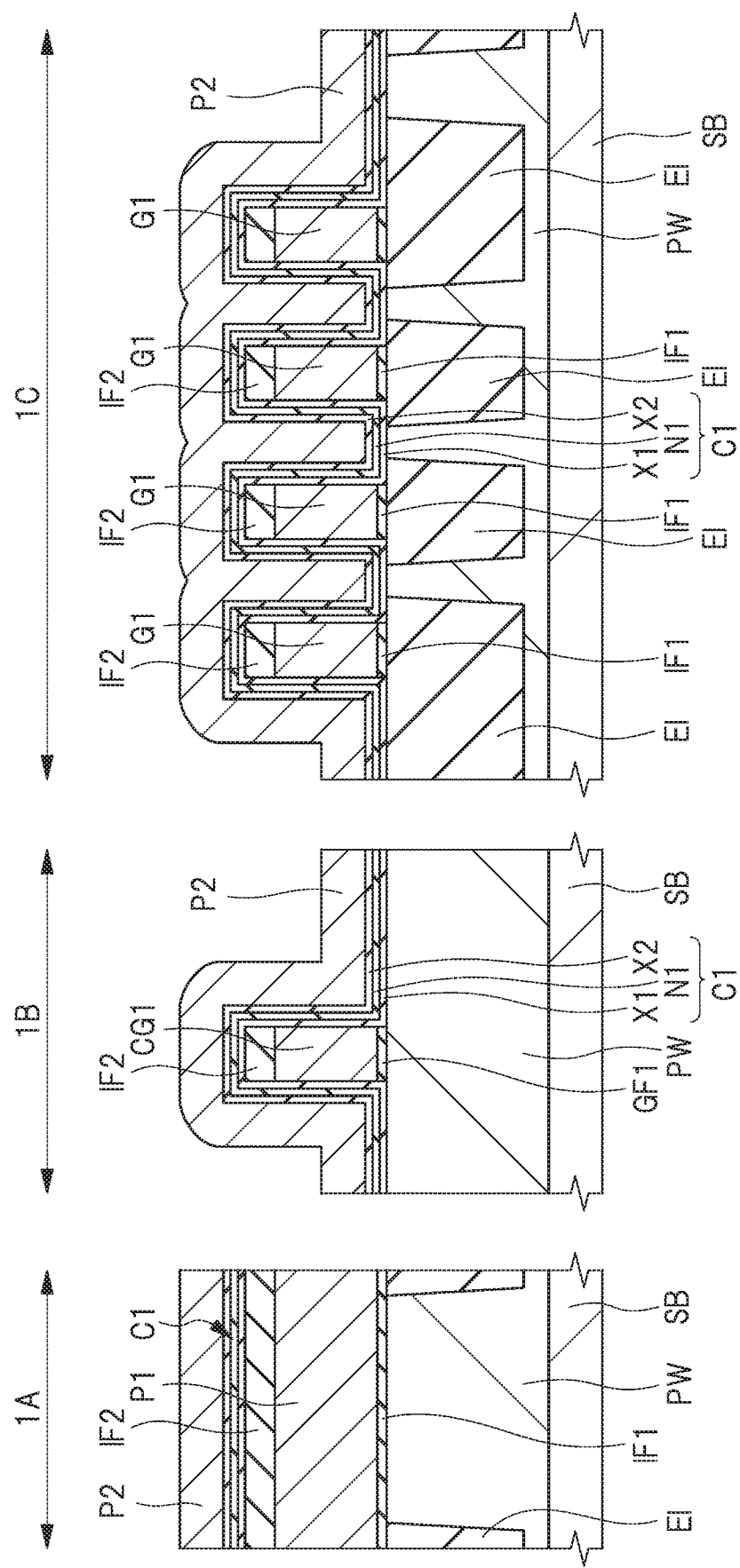
FIG. 6 is a cross-sectional view of the semiconductor device in the manufacturing process continued from FIG. 5.

Next, as shown in FIG. 6, the ONO film C1 is formed (step ST4 of FIG. 1). Namely, a silicon oxide film (bottom oxide film) X1, a silicon nitride film (charge storage film) N1, a silicon oxide film (top oxide film) X2 and a polysilicon film P2 are sequentially formed over the entire main surface of the semiconductor substrate SB. The silicon oxide film X1 can be formed by, for example, the thermal oxidation method, and each of the silicon nitride film N1, silicon oxide film X2 and polysilicon film P2 can be formed by, for example, the CVD method. A film thickness of a stacked film constituted by the silicon oxide film X1, the silicon nitride film N1 and the silicon oxide film X2 is 15 nm to 25 nm, and a film thickness of the polysilicon film P2 is 40 nm to 80 nm. The stacked film constituted by the silicon oxide film X1, the silicon nitride film N1 and the silicon oxide film X2 configure the ONO (oxide-nitride-oxide) film C1. The polysilicon film P2 is, for example, an n-type semiconductor film into which n-type impurities (such as P (phosphorus)) are implanted.

In this manner, the ONO film C1 and the polysilicon film P2 are stacked over the insulating film IF2 in the logic circuit region 1A. In addition, the ONO film C1 and the polysilicon film P2 are stacked in the memory cell region 1B so as to cover the upper surface of the semiconductor substrate SB and side and upper surfaces of a stacked pattern constituted by the gate insulating film GF1, the insulating film IF2 and the control gate electrode CG1. Further, the ONO film C1 and the polysilicon film P2 are stacked in the TEG region 1C so as to cover the upper surface of the semiconductor substrate SB and side and upper surfaces of a stacked pattern constituted by the insulating films IF1 and IF2 and the gate pattern G1.

Here, a film thickness of a stacked film constituted by the ONO film C1 and the polysilicon film P2 is greater than half a distance between the gate patterns G1 adjacent to each other in the TEG region 1C. In addition, the film thickness of the ONO film C1 is less than the distance between the gate patterns G1 adjacent to each other in the TEG region 1C. Thus, the stacked film constituted by the ONO film C1 and the polysilicon film P2 is completely buried between the gate patterns G1 adjacent to each other.

In a case where the film thickness of the ONO film C1 is 40 nm to 80 nm and the film thickness of the polysilicon film P2 is 40 nm to 80 nm, the stacked film constituted by the ONO film C1 and the polysilicon film P2 can be buried at a maximum width of 110 nm to 210 nm between the gate patterns G1 adjacent to each other. Here, the distance between the gate patterns G1 adjacent to each other is set to be smaller than 110 nm to 210 nm. Namely, a space between the gate patterns G1 is set to, for example, 80 nm to 180 nm.

In addition, it is preferable that a width of the gate pattern G1 in the X direction is at a minimum width that can be processed from the viewpoint of achieving a miniaturized capacitor element formed in the TEG region 1C and an increased capacitance of the capacitor element and the like. The width of the gate pattern G1 in the X direction is, for example, 50 nm to 150 nm. In addition, a width of the active region just below the polysilicon film P2 in the TEG region 1C in the X direction is less than or equal to a width of the polysilicon film P2 in the X direction, and is, for example, 50 nm to 100 nm.

Note that, although a case where a trench between the gate patterns G1 adjacent to each other is completely filled with the ONO film C1 and the polysilicon film P2 will be described, the trench does not need to be completely filled. In other words, a concave portion may be formed in an upper surface of the polysilicon film P2 buried between the gate patterns G1 adjacent to each other such that a bottom surface of the concave portion is located at a lower position than an upper surface of the insulating film IF2 on the gate patterns G1 sandwiching the concave portion.

Figure 7:
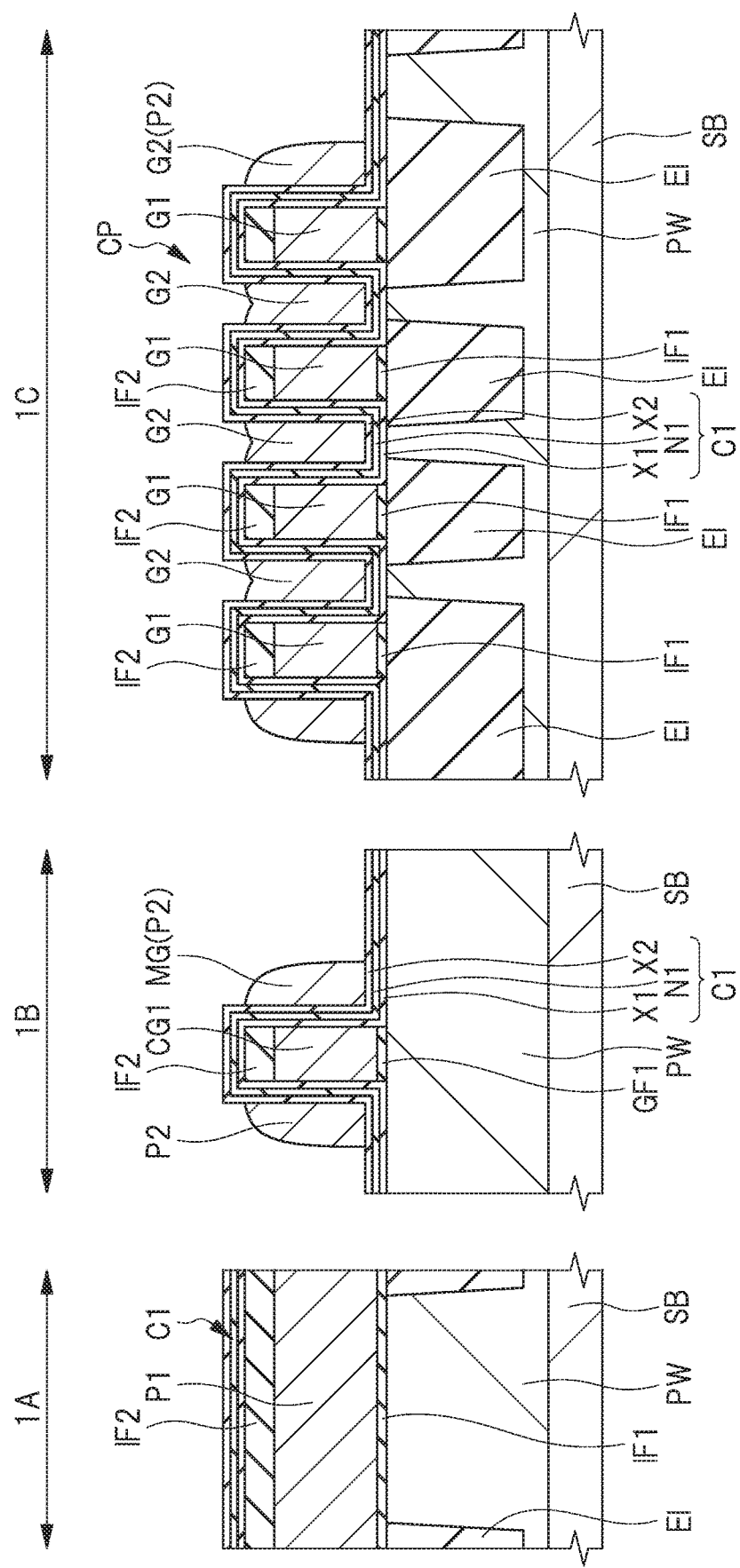
FIG. 7 is a cross-sectional view of the semiconductor device in the manufacturing process continued from FIG. 6.

Next, as shown in FIG. 7, a memory gate electrode MG and a gate pattern G2 are formed (step ST5 of FIG. 1). Namely, a portion of the polysilicon film P2 is removed by using the dry etching method to expose an upper surface of the silicon oxide film X2. In other words, the polysilicon film P2 is etched back by anisotropic dry etching such that the polysilicon film P2 remains only in regions adjacent to a side surface of each of the control gate electrode CG1 and gate pattern G1 via the ONO film C1.

At this time, a sidewall spacer-like polysilicon film P2 remains on the side surface of the gate pattern G1 in the TEG region 1C not facing another gate pattern G1, via the ONO film C1. In other words, in the TEG region 1C, the sidewall spacer-like polysilicon film P2 is formed in a self-aligning manner on one of the side surfaces of the endmost gate pattern G1 among the plurality of gate patterns G1 arranged side-by-side in the X direction. In the TEG region 1C, the gate pattern (gate electrode, upper electrode) G2 made of the polysilicon film P2 is formed by the etching process.

Likewise, in the memory cell region 1B, the sidewall spacer-like polysilicon film P2 is formed in a self-aligning manner on both side surfaces of the control gate electrode CG1, via the ONO film C1. The polysilicon film P2 adjacent to one of the side surfaces of the control gate electrode CG1 in a lateral direction configures the memory gate electrode MG. In addition, in the logic circuit region 1A, the entire polysilicon film P2 on the polysilicon film P1 is removed.

Note that the trench between the gate patterns G1 adjacent to each other in the TEG region 1C is still filled with the ONO film C1 and the gate pattern G2, and the gate pattern G2 in the trench is not formed in a sidewall spacer-like manner. Thus, in the TEG region 1C, capacitor elements CP insulated from each other in the vertical direction via the ONO film C1 and being constituted by the gate pattern (upper electrode) G2 and the semiconductor substrate (lower electrode) SB are formed. The gate pattern G2 which is an upper electrode is formed in a self-aligning manner without using a mask (photomask). The capacitor element CP is a test element (TEG) in which the charge between the active regions formed in a stripe-like manner in plan view and the gate patterns G2 formed just above these active regions is accumulated. The ONO film C1 is interposed between the gate patterns G1 and G2 adjacent to each other such that the gate patterns G1 and G2 are insulated from each other.

Here, each of the stripe-like active regions formed in the TEG region 1C entirely overlaps the gate pattern G2 in plan view. In other words, a width of the upper surface (active region) of the stripe-like semiconductor substrate SB in the lateral direction (X direction) exposed from the element isolation regions EI in the TEG region 1C in plan view is less than or equal to a width of the stripe-like gate patterns G2 in the lateral direction (X direction). In addition, the width of the active region in the longitudinal direction (Y direction) in plan view is less than or equal to a width of the stripe-like gate patterns G2 in the longitudinal direction (Y direction). One of the main features of the present embodiment is that a capacitor element for testing is constituted by the active region and the gate pattern G2 overlapping each other in plan view, and that the gate pattern G1 and the element isolation region EI do not overlap each other in plan view. A portion of the active region in the TEG region 1C is not covered by any of the gate patterns G1 and G2.

Figure 8:
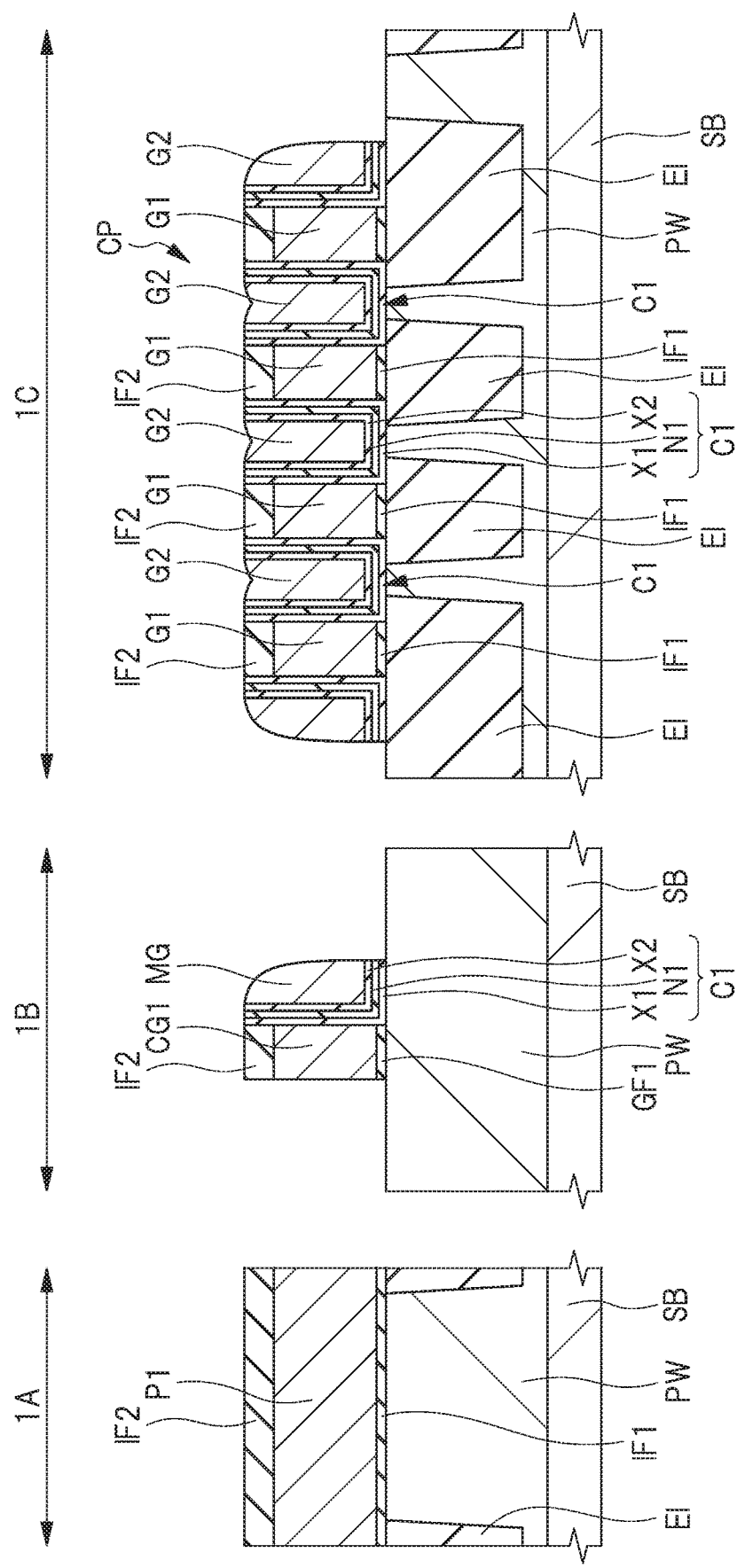
FIG. 8 is a cross-sectional view of the semiconductor device in the manufacturing process continued from FIG. 7.

Next, as shown in FIG. 8, in the memory cell region 1B, the polysilicon film P2 adjacent to one of the side surfaces of the control gate electrode CG1 is removed by using the photolithography technique and the wet etching method. At this time, in the TEG region 1C, the gate pattern G2 in the vicinity of an end portion in the longitudinal direction (X direction) of the gate pattern G1 extending in the X direction and having a comb-like layout in plan view is removed (see FIG. 12).

Subsequently, a portion of the ONO film C1 is removed by using the wet etching method to expose the upper surface of the semiconductor substrate SB and the upper and side surfaces of each of the control gate electrode CG1, gate pattern G1 and insulating film IF2. In this manner, the ONO film C1 is removed with the exception of the ONO film C1 in contact with the side and bottom surfaces of each of the memory gate electrode MG and gate pattern G2.

Figure 9:
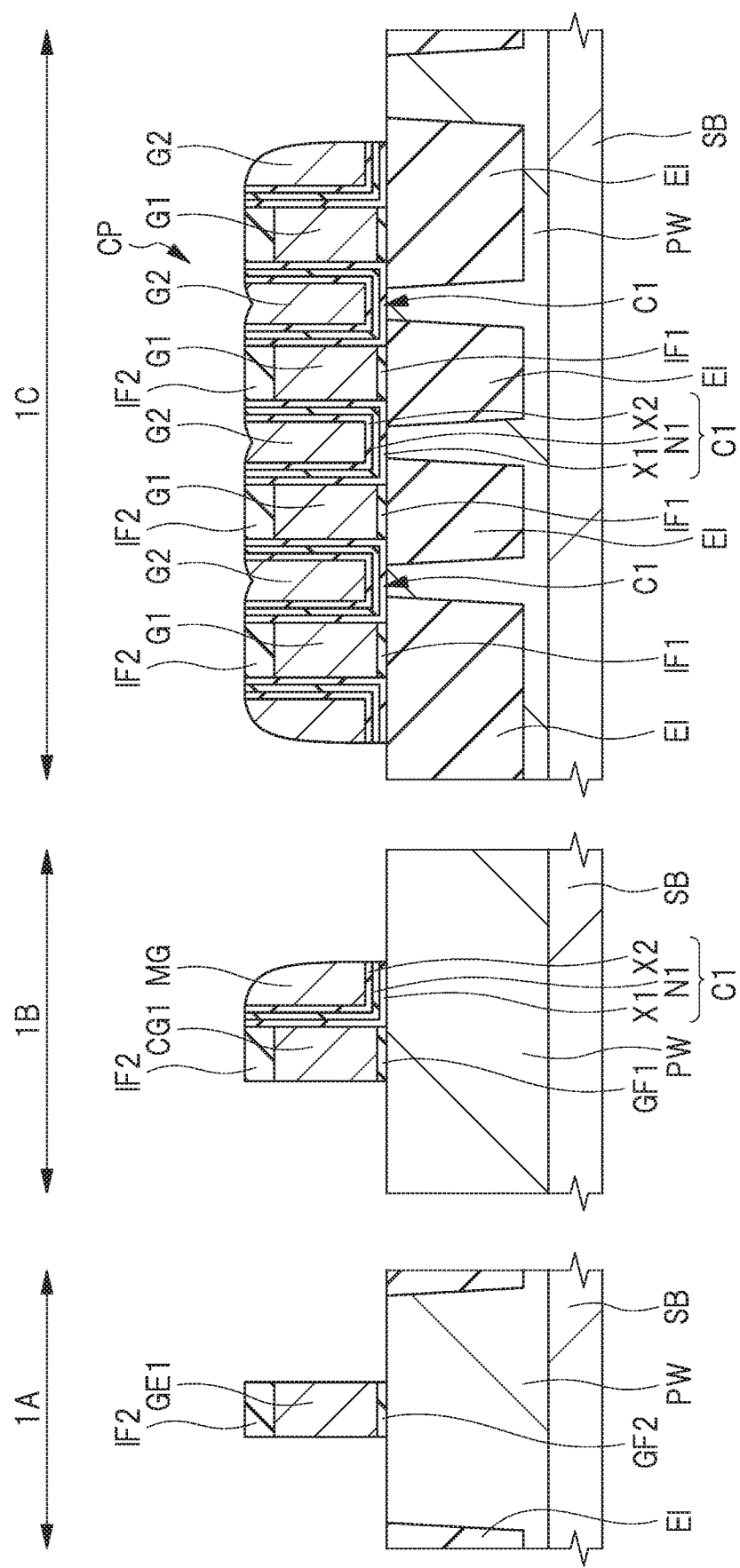
FIG. 9 is a cross-sectional view of the semiconductor device in the manufacturing process continued from FIG. 8.

Next, as shown in FIG. 9, the polysilicon film P1 and the insulating film IF1 in the logic circuit region 1A are processed (patterned) by using the photolithography technique and the etching method. In this manner, a gate electrode GE1 made of the polysilicon film P1 and a gate insulating film GF2 made of the insulating film IF1 are formed in the logic circuit region 1A. This etching process is performed in a state where the memory cell region 1B and the TEG region 1C are protected by a photo resist pattern (not shown).

Figure 10:
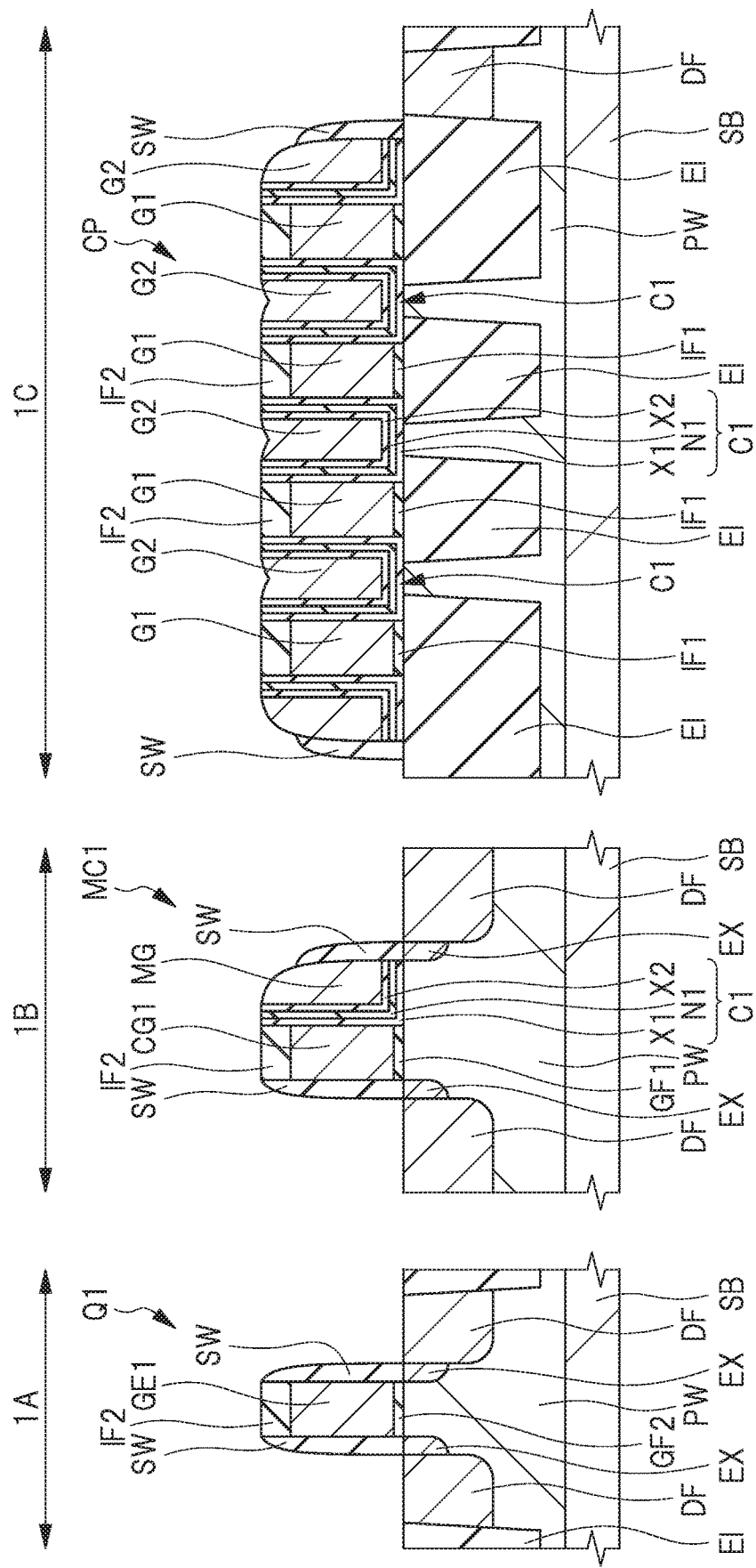
FIG. 10 is a cross-sectional view of the semiconductor device in the manufacturing process continued from FIG. 9.

Next, as shown in FIG. 10, by using the ion implantation method, n-type impurities (such as As (arsenic)) are implanted into the upper surface of the semiconductor substrate SB at a relatively low concentration level. In this manner, an extension region EX which is an n-type semiconductor region is formed in the main surface of the semiconductor substrate SB in the logic circuit region 1A and the memory cell region 1B. In the logic circuit region 1A, the extension region EX is formed in the upper surface of the semiconductor substrate SB beside the gate electrode GE1. In the memory cell region 1B, the extension region EX is formed in the upper surface of the semiconductor substrate SB exposed beside a pattern including the control gate electrode CG1 and the memory gate electrode MG adjacent to each other via the ONO film C1.

Next, after an insulating film is formed over the entire main surface of the semiconductor substrate SB by using, for example, the CVD method, a portion of the insulating film is removed by using the dry etching method to expose the upper surface of the semiconductor substrate SB and form a sidewall spacer SW made of the insulating film. The sidewall spacer SW is formed in a self-aligning manner on both side surfaces of the gate electrode GE1, the exposed side surface of the control gate electrode CG1, the exposed side surface of the memory gate electrode MG, and both side surfaces of the capacitor element CP. The sidewall spacer SW is made of, for example, a silicon oxide film, a stacked film constituted by a silicon nitride film and a silicon oxide film, or the like.

Thereafter, by using the ion implantation method, n-type impurities (such as As (arsenic)) are implanted into the upper surface of the semiconductor substrate SB at a higher concentration level than the concentration level used for forming the extension region EX. In this manner, a diffusion region DF having a higher impurity concentration level than the extension region EX is formed in the main surface of the semiconductor substrate SB in the logic circuit region 1A, the memory cell region 1B and the TEG region 1C. The diffusion region DF is an n-type semiconductor region that is deeper than the extension region EX.

In the present embodiment, in each of the logic circuit region 1A and memory cell region 1B, the extension region EX is formed in a single ion implantation process, the diffusion region DF is formed in another single implantation process. However, in practice, it is considered that the ion implantation processes are separately performed on the regions depending on differences in the type of element, conductivity type of the element or the like, and that the extension region EX or the diffusion region DF are formed under various conditions.

In the logic circuit region 1A, the diffusion region DF is formed in the upper surface of the semiconductor substrate SB exposed from the gate electrode GE1 and the sidewall spacer SW on the side surface of the gate electrode GE1. In the memory cell region 1B, the diffusion region DF is formed in the upper surface of the semiconductor substrate SB exposed from the pattern including the control gate electrode CG1 and the memory gate electrode MG in contact with each other via the ONO film C1 and the sidewall spacer SW on the side surface of the pattern. In the TEG region 1C, the diffusion region DF is formed in the upper surface of the active region exposed from each of the gate patterns G1 and G2.

The diffusion region DF is formed such that a pair of source/drain regions constituted by the extension region EX and the diffusion region DF adjacent to the extension region EX is formed in the upper surface of the semiconductor substrate SB in each of the logic circuit region 1A and memory cell region 1B.

By the above-described process, a transistor (MOSFET, MOS-type field effect transistor) Q1 having the gate electrode GE1 and the source/drain regions formed in the upper surface of the semiconductor substrate SB so as to sandwich the gate electrode GE1 is formed on the semiconductor substrate SB in the logic circuit region 1A. In addition, a memory cell MC1 having the control gate electrode CG1, the memory gate electrode MG adjacent to the side surface of the control gate electrode CG1 via the ONO film C1, and the source/drain regions formed in the upper surface of the semiconductor substrate SB so as to sandwich the control gate electrode CG1 and the memory gate electrode MG is formed on the semiconductor substrate SB in the memory cell region 1B. The memory cell MC1 which is a MONOS (metal-oxide-nitride-oxide semiconductor) memory has at least the silicon nitride film N1 of the ONO film C1 which functions as a charge storage film (charge storage unit).

Figure 11:
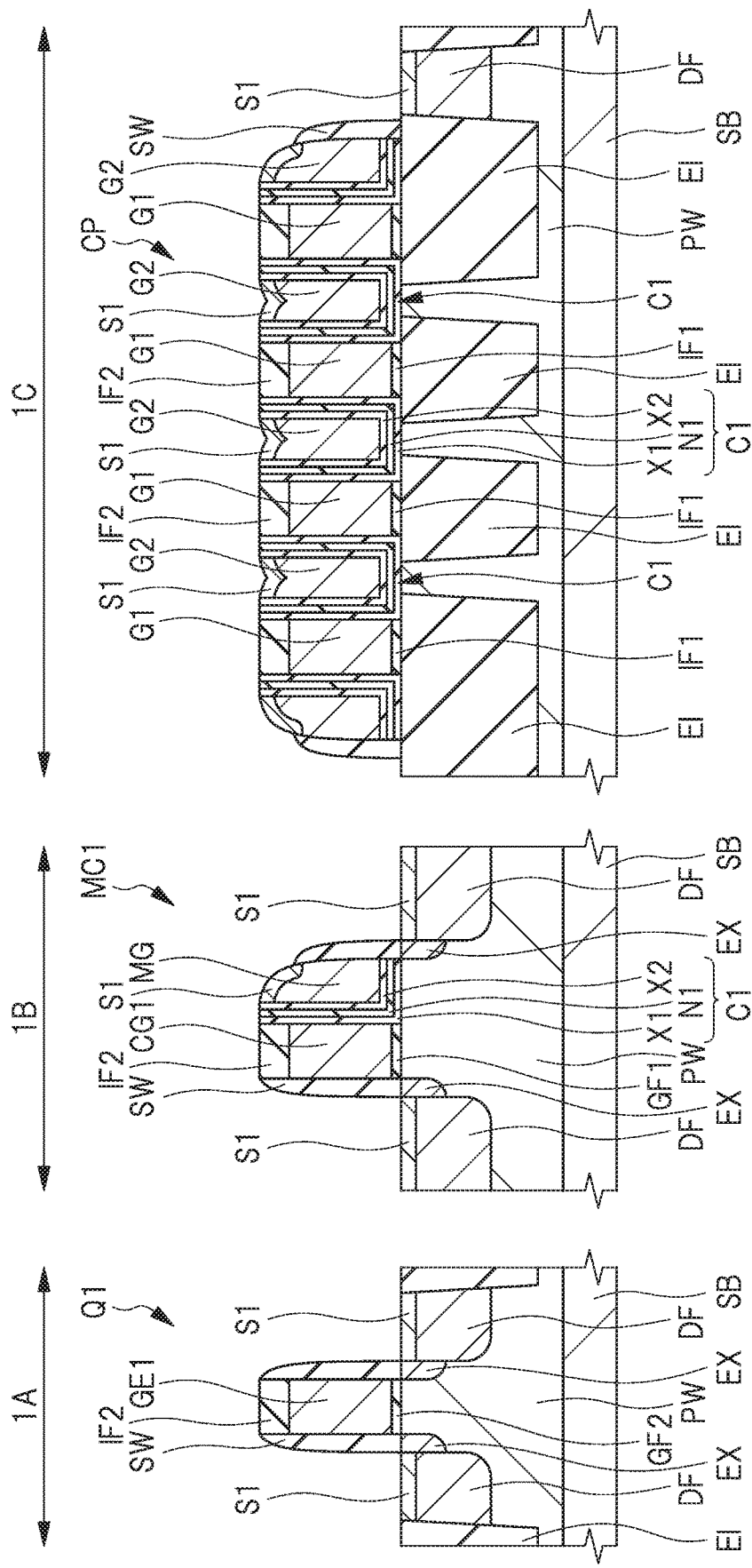
FIG. 11 is a cross-sectional view of the semiconductor device in the manufacturing process continued from FIG. 10.
Figure 12:
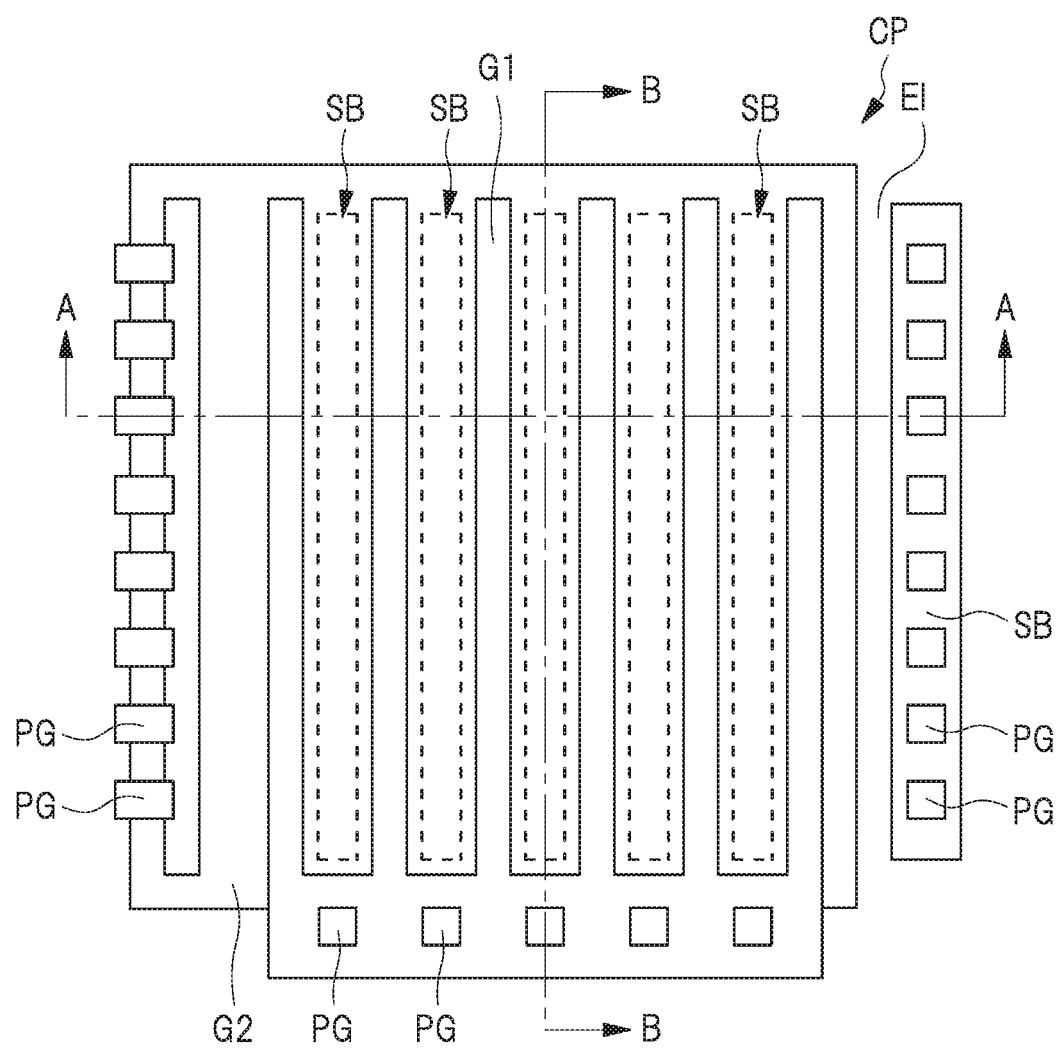
FIG. 12 is a plan view of the semiconductor device in the manufacturing process continued from FIG. 11.

Next, as shown in FIG. 11, a silicide layer S1 is formed on an upper surface of each of the diffusion region DF, gate electrode GE1, control gate electrode CG1, memory gate electrode MG and gate patterns G1 and G2 by using the known salicide technique. The silicide layer S1 is a conductive film made of, for example, cobalt silicide (CoSi). The silicide layer S1 is formed by forming a metal film made of Co (cobalt) or the like on the semiconductor substrate SB and then making the metal film and the silicon film react by heat treatment.

Figure 14:
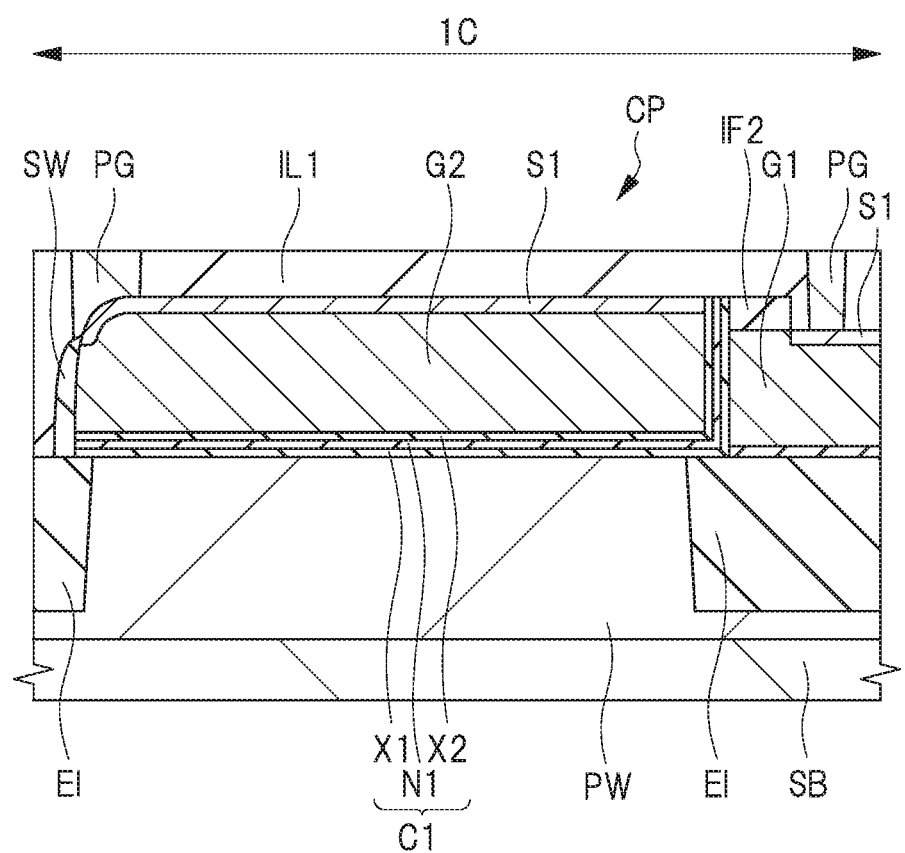
FIG. 14 is a cross-sectional view of the semiconductor device in the manufacturing process continued from FIG. 11.

In FIG. 11, the silicide layer S1 on the upper surface of each of the gate electrode GE1, control gate electrode CG1 and gate pattern G1 is not shown. The silicide layer S1 on the upper surface of each of the gate electrode GE1, control gate electrode CG1 and gate pattern G1 is formed in a feeding region (not shown). In the feeding region, after a step of forming the control gate electrode CG1 and the gate pattern G1 described with reference to FIG. 5 and before a step of forming the silicide layer S1, a portion of the insulating film IF2 is removed to expose a portion of the upper surface of each of the control gate electrode CG1 and the gate pattern G1. FIG. 14 used for descriptions below shows a structure in which the silicide layer S1 is formed on the upper surface of the gate pattern G1 exposed from the insulating film IF2 in the feeding region for the gate pattern G1.

Figure 13:
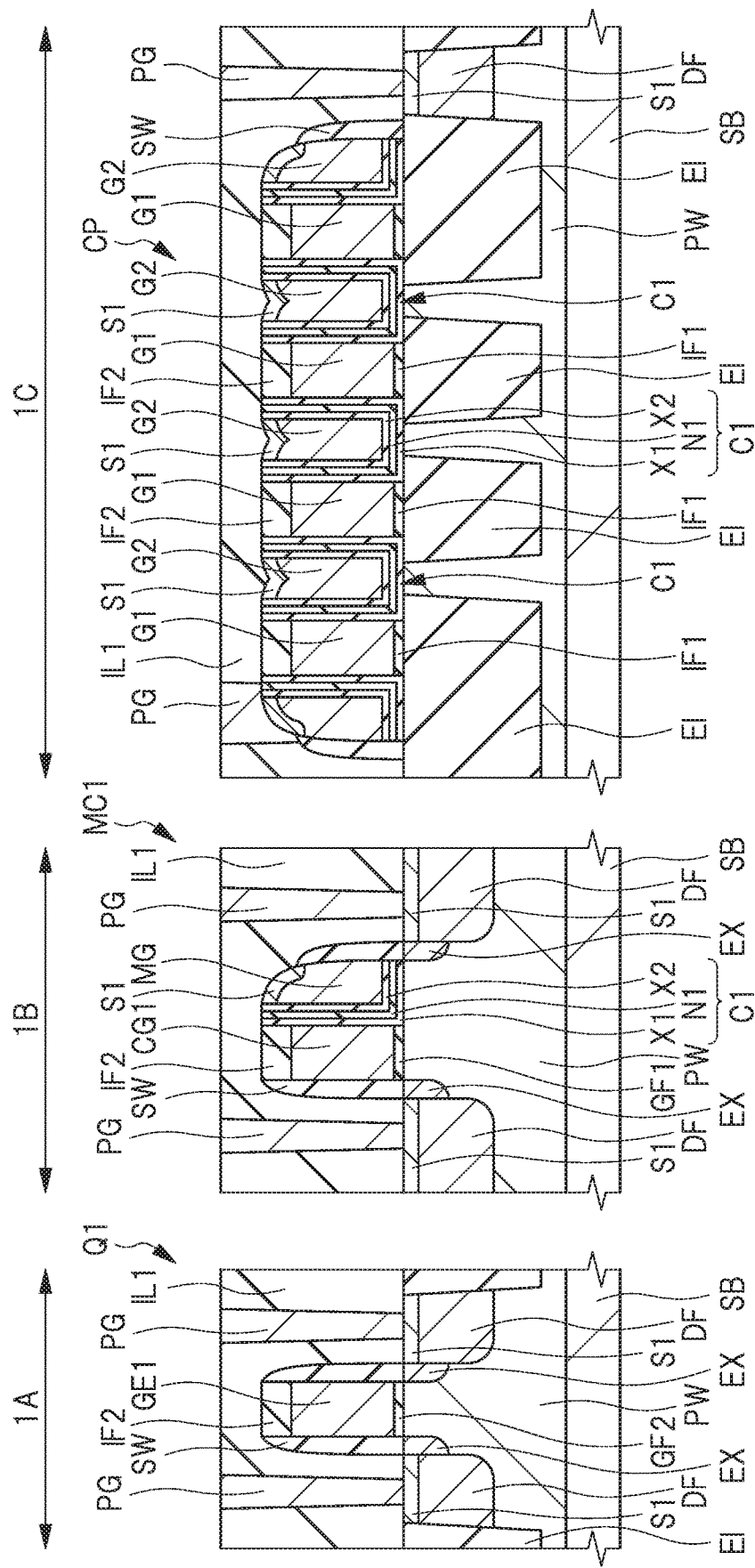
FIG. 13 is a cross-sectional view of the semiconductor device in the manufacturing process continued from FIG. 11.

Next, as shown in FIGS. 12 to 14, an interlayer insulating film IL1 and plugs PG are formed. FIG. 12 shows a planar layout of the capacitor element CP in the TEG region 1C. The TEG region 1C of FIG. 13 shows the cross section taken along a line A-A of FIG. 12. FIG. 14 shows the cross section taken along a line B-B of FIG. 12. The cross section of the TEG region 1C of FIG. 13 includes the alternately arranged gate patterns G1 and G2 and a feeding region for each of the gate pattern G2 and semiconductor substrate SB, and is a cross section along the lateral direction (X direction) of the gate pattern G2. The cross section shown in FIG. 14 includes the feeding region for the gate pattern G1 and the gate pattern G2, and is a cross section along an extending direction (longitudinal direction, Y direction) of the gate pattern G2.

In the TEG region 1C of FIG. 13, the active region is formed just below the gate pattern G2 beside the gate pattern G2 to which the plug PG is connected. In practice, the active region is not formed just below the gate pattern G2 beside another gate pattern G2 in the X direction to which the plug PG is connected, as shown in FIG. 12. However, as shown in FIG. 13 and other cross-sectional views of the TEG region 1C, the active region may be formed just below the gate pattern G2 beside the gate pattern G2 to which the plug PG is connected.

FIG. 12 only shows the element isolation region EI, the active region of the semiconductor substrate SB, the gate patterns G1 and G2 and the plugs PG, without showing the interlayer insulating film, the sidewall spacer, the cap film on the gate pattern G1, the ONO film, the silicide layer and the like. Broken lines in FIG. 12 indicate a contour of the semiconductor substrate SB surrounded by the element isolation region EI in a region below the gate pattern G2, that is, a contour of the active region. In other words, in plan view, the upper surface (active region) of the semiconductor substrate SB is exposed from the element isolation regions EI in rectangular regions indicated by broken lines in FIG. 12.

Here, a thin etching stopper film (not shown) made of, for example, a silicon nitride film and the thick interlayer insulating film IL1 made of, for example, a silicon oxide film are sequentially formed over the entire upper surface of the semiconductor substrate SB by using the CVD method or the like.

Subsequently, an upper surface of the interlayer insulating film IL1 is polished by using, for example, the CMP (Chemical Mechanical Polishing) method to be planarized. At this time, the insulating film IF2, the silicide layer S1, the gate electrode GE1, the control gate electrode CG1, the memory gate electrode MG and the gate patterns G1 and G2 are not exposed and are still covered by the interlayer insulating film IL1 even after polishing.

Subsequently, a plurality of contact holes penetrating the interlayer insulating film IL1 and the etching stopper film (not shown) are formed by using the photolithography technique and the dry etching method.

In the logic circuit region 1A, the plurality of contact holes penetrating the interlayer insulating film IL1 and the etching stopper film are formed to expose an upper surface of the silicide layer S1 on an upper portion of each of the diffusion region DF and gate electrode GE1. Likewise, in the memory cell region 1B, the upper surface of the silicide layer S1 on an upper portion of each of the diffusion region DF, control gate electrode CG1 and memory gate electrode MG is exposed. Likewise, in the TEG region 1C, the upper surface of the silicide layer S1 on an upper portion of each of the gate patterns G1 and G2 and diffusion region DF is exposed. Note that the contact hole formed just above each of the gate electrode GE1, control gate electrode CG1 and memory gate electrode MG is not shown. These contact holes are formed in regions not shown in FIGS. 12 to 14.

Subsequently, for example, a W (tungsten) film is buried in each of the contact holes via a barrier conductor film containing, for example, Ti (titanium), and excessive conductive film on the interlayer insulating film IL1 is removed. In this manner, the plug (contact plug, conductive connecting portion) PG including the barrier conductor film and the tungsten film buried in each of the contact holes is formed. Each of the plugs PG is a conductor formed for supplying a predetermined potential to the diffusion region DF, the control gate electrode CG1, the memory gate electrode MG, the gate patterns G1 and G2 or the semiconductor substrate SB.

Specifically, in a step of forming the plug PG, the barrier conductor film (not shown) is first formed over the entire upper surface of the semiconductor substrate SB by using the sputtering method or the like such that an inner surface of the contact hole is covered by the barrier conductor film. Thereafter, the tungsten film (main conductor film) is formed on the semiconductor substrate SB by using the sputtering method or the like to completely fill each of the contact holes with the tungsten film. Subsequently, the excessive barrier conductor film and tungsten film on the interlayer insulating film IL1 are removed by using the CMP method or the like to expose the upper surface of the interlayer insulating film IL1. In this manner, the upper surfaces of the interlayer insulating film IL1 and tungsten film are planarized, and the plug PG constituted by the barrier conductor film and the tungsten film is formed in each of the contact holes.

As shown in FIG. 12, the capacitor element CP has the gate patterns G1 and G2 alternately arranged in the X direction. The gate patterns G1 and G2 are arranged such that the comb-like patterns interdigitate with each other in plan view. In addition, a single gate pattern G1 spaced apart from the comb-like gate pattern G1 in the X direction and extending in the Y direction is formed, and the gate pattern G2 surrounding the side surface of the gate pattern G1 and being formed just above the element isolation region EI configures the feeding region for the gate pattern G2 just above the active region. The active region arranged between the gate patterns G1 adjacent to each other to be spaced apart from the gate pattern G1 overlaps the gate pattern G2 in plan view. In other words, the gate pattern G1 and the active region do not overlap each other in plan view.

As shown in FIGS. 12 and 13, the plug PG is formed across a region just above the gate pattern G1 and a region just above the gate pattern G2 beside the gate pattern G1. The plug PG is a conductive connecting portion for supplying a potential to the gate pattern G2, and is electrically connected to the gate pattern G2. In addition, the plug PG for supplying a potential to the semiconductor substrate SB is electrically connected to the diffusion region DF via the silicide layer S1, the diffusion region DF being formed in the active region exposed from the gate patterns G1 and G2. As shown in FIG. 12, the plurality of plugs PG connected to the gate pattern G2 and the plurality of plugs PG electrically connected to the semiconductor substrate SB are formed side-by-side in the Y direction.

As shown in FIGS. 12 and 14, the plurality of plugs PG are connected to the upper surface of a portion of the comb-like gate pattern G1 extending in the X direction via the silicide layer S1. Namely, in the feeding region for the gate pattern G1, the plug PG is electrically connected to the gate pattern G1 in a region where a portion of the insulating film IF2 on the gate pattern G1 has been removed. A single active region extending in the Y direction is entirely formed just below a single gate pattern G2 extending in the Y direction. However, no active region is formed just below the gate pattern G1.

As shown in the logic circuit region 1A of FIG. 13, the gate electrode GE1 is formed on the semiconductor substrate SB via the gate insulating film GF2, and both side surfaces of the gate electrode GE1 are covered by the sidewall spacer SW. The pair of source/drain regions constituted by n-type semiconductor regions is formed on the upper surface (main surface) of the semiconductor substrate SB so as to sandwich the upper surface of the semiconductor substrate SB just below the gate electrode GE1. Each of the source/drain regions include the diffusion region DF and the extension region EX arranged closer to the gate electrode GE1 than to the diffusion region DF in plan view. The gate electrode GE1 and the source/drain regions configure the transistor Q1.

As shown in the memory cell region 1B of FIG. 13, the control gate electrode CG1 formed via the gate insulating film GF1, the insulating film IF2 formed on the control gate electrode CG1, and the memory gate electrode MG adjacent to the side surface of the control gate electrode CG1 via the ONO film C1 are formed on the semiconductor substrate SB. In addition, the ONO film C1 is formed between the semiconductor substrate SB and the memory gate electrode MG and is continuously formed from between the semiconductor substrate SB and the memory gate electrode MG to between the control gate electrode CG1 and the memory gate electrode MG. In other words, the ONO film C1 including the charge storage film portion has an L-shaped cross section. The source/drain regions are formed in the upper surface of the semiconductor substrate SB so as to sandwich the control gate electrode CG1 and the memory gate electrode MG. As in the logic circuit region 1A, the source/drain regions have the extension region EX and the diffusion region DF.

The control gate electrode CG1 and the source/drain regions configure a control transistor, and the memory gate electrode MG and the source/drain regions configure a memory transistor. In other words, the control transistor and the memory transistor share the same pair of source/drain regions and share a single channel region. The control transistor and the memory transistor configure the memory cell MC1 which is a nonvolatile memory element (nonvolatile memory).

As shown in the TEG region 1C of FIG. 13, a plurality of stripe-like trenches are formed in the main surface of the semiconductor substrate SB, and the element isolation region EI is buried in the trenches. In other words, the plurality of element isolation regions EI extending in the Y direction are formed side-by-side in the X direction. The plurality of active regions which are portions of the upper surface of the semiconductor substrate SB exposed from the element isolation regions EI extend in the Y direction and are arranged side-by-side in the X direction. The gate pattern G1 is formed just above each of the stripe-like element isolation regions EI via the insulating film IF1. The gate pattern G2 is buried between the gate patterns G1 adjacent to each other in the X direction, and the ONO film C1 is continuously formed between the gate pattern G2 and the gate pattern G1 and between the gate pattern G2 and the semiconductor substrate SB. In other words, the ONO film C1 has a U-shaped cross section. Namely, lower and side surfaces of the gate pattern G2 are continuously covered by the ONO film C1.

The gate pattern G2 and the active region (semiconductor substrate SB) configure the capacitor element CP. The capacitor element CP is a test element provided for measuring the film thickness of the ONO film C1 just below the gate pattern G2 by measuring the charge between the gate pattern G2 which is an upper electrode and the active region which is a lower electrode when a predetermined potential difference occurs between the gate pattern G2 and the active region. A width of the upper surface of the active region just below the gate pattern G2 in the X direction is smaller than the width of the gate pattern G2 in the X direction such that the upper surface of the active region does not overlap the gate pattern G1 in plan view.

Here, the gate pattern G1 is made of a film of the same layer as the control gate electrode CG1, the gate pattern G2 is made of a film of the same layer as the memory gate electrode MG, and the ONO film C1 in the TEG region 1C is made of a film of the same layer as the ONO film C1 in the memory cell region 1B. Here, "film of the same layer" refers to a relation between a plurality of films that were originally a single film being separated into a plurality of films in a patterning process or the like. In other words, "film of the same layer" refers to films formed in the same step. The ONO film C1 in the TEG region 1C and the ONO film C1 in the memory cell region 1B are films of the same layer, whereby each of the ONO films C1 includes a charge storage film.

Figure 15:
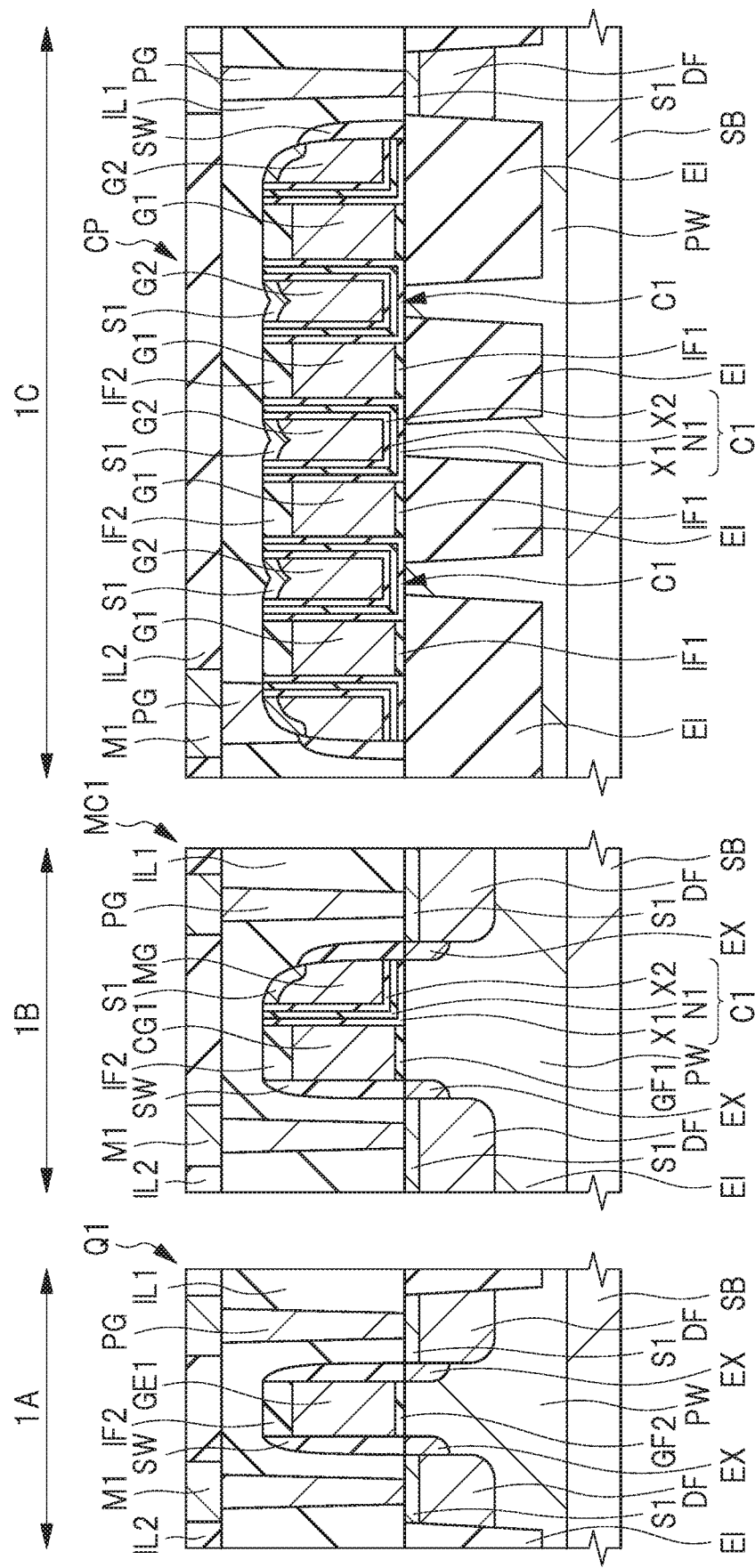
FIG. 15 is a cross-sectional view of the semiconductor device in the manufacturing process continued from FIG. 14.
Figure 16:
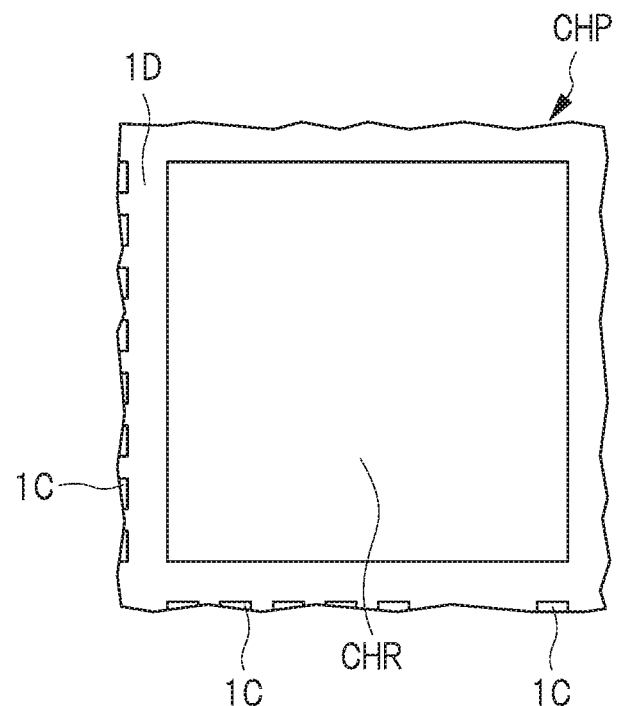
FIG. 16 is a plan view of the semiconductor device in the manufacturing process continued from FIG. 15.

Next, as shown in FIG. 15, the wiring layer is formed (step ST6 of FIG. 1). Namely, an interlayer insulating film IL2 made of $SiO_2$, SiOC or the like is formed on the interlayer insulating film IL1 by using, for example, the CVD method. Thereafter, a plurality of wiring trenches penetrating the interlayer insulating film IL2 and exposing the upper surface of the plug PG are formed by using the photolithography technique and the dry etching method. Subsequently, after each of the wiring trenches is completely filled with a metal film formed by using the sputtering method, the electrolytic plating method and the like so as to cover side and bottom surfaces of each of the wiring trenches, excessive metal film on the interlayer insulating film IL2 is removed to expose an upper surface of the interlayer insulating film IL2 and form a wiring M1 made of the metal film remaining in each of the wiring trenches.

Specifically, in a step of forming the wiring M1, after the plurality of wiring trenches penetrating the interlayer insulating film IL2 and the interlayer insulating film IL2 are formed as described above, a barrier conductor film (not shown) containing, for example, Ta (tantalum) is formed over the entire upper surface of the semiconductor substrate SB by using the sputtering method or the like such that a surface of each of the wiring trenches and interlayer insulating film IL2 is covered by the barrier conductor film. Next, after a thin seed film made of Cu (copper) is formed on the semiconductor substrate SB by using the sputtering method, a Cu (copper) film which becomes a main conductor film of the wiring M1 is formed by using the electrolytic plating method to completely fill each of the wiring trenches. Subsequently, the excessive barrier conductor film and Cu (copper) film on the interlayer insulating film IL2 are removed by using the CMP method or the like such that the wiring M1 constituted by the barrier conductor film, the seed layer and the main conductor film is formed in each of the wiring trenches.

By the CMP process in which the wiring M1 is formed, the upper surface of the interlayer insulating film IL2 is exposed, and the upper surface of each of the interlayer insulating film IL2 and wiring M1 is planarized. In subsequent steps, a plurality of wiring layers including an interlayer insulating film, a wiring in the wiring trench formed in the interlayer insulating film and a via in a via hole formed in the interlayer insulating film are stacked over the interlayer insulating film IL2 to form an upper layer wiring (not shown). In this manner, the semiconductor device of the present embodiment is substantially completed. Here, an electrode pad for bonding and an electrode pad for probe tests are formed on an upper portion of the wiring layer.

Next, an electrical test is performed by using the capacitor element CP in the TEG region 1C shown in FIG. 15 to measure the film thickness of the ONO film C1 (step ST7 of FIG. 1). Here, a predetermined potential is applied to each of the gate pattern G2 and active region in the TEG region 1C to generate a potential difference between the gate pattern G2 and the active region. In this manner, charge is accumulated between the gate pattern G2 which is an upper electrode and the active region which is a lower electrode. Note that, when measuring capacitance, a voltage may be applied to the gate pattern G1. However, the gate pattern G1 may also be in an electrically floating state.

Specifically, when measuring an inversion capacitance which is a capacitance between the gate pattern G2 and the active region, a positive voltage is applied to the gate pattern G2 while 0 V is applied to the active region, whereby the control gate electrode CG1 is in a floating state. Alternatively, when measuring the inversion capacitance, a positive voltage may be applied to both gate patterns G1 and G2 while 0 V is applied to the active region. When measuring a storage capacitance which is a capacitance between the gate pattern G2 and the active region, a negative voltage is applied to the gate pattern G2 while 0 V is applied to the active region, whereby the control gate electrode CG1 is in a floating state. Alternatively, when measuring the storage capacitance, a negative voltage may be applied to both gate patterns G1 and G2 while 0 V is applied to the active region.

By measuring the charge, the film thickness of the ONO film C1 can be measured (calculated). This is because the smaller a gap between the electrodes, the smaller the electrostatic capacitance of the capacitor element (capacitor) becomes, whereby capacitance characteristics change depending on the size of the gap between the electrodes. Here, "film thickness of the ONO film C1" refers to the film thickness of the ONO film C1 interposed between the gate pattern G2 configuring the capacitor and the active region just below the gate pattern G2, and not to the film thickness of the ONO film C1 formed between the gate patterns G1 and G2.

Namely, the electrical test is performed on the premise that the film thickness of the ONO film C1 just below the memory gate electrode MG formed in the memory cell region 1B of the semiconductor wafer WF (see FIG. 2) is equal to the film thickness of the ONO film C1 just below the gate pattern G2 in the TEG region 1C. By measuring the film thickness of the ONO film C1 in the TEG region 1C, the film thickness of the ONO film C1 in the memory cell region 1B can be evaluated. Writing characteristics of the memory cell MC1 which is a split-gate type MONOS memory greatly depends on the film thickness of the ONO film C1. For example, in a case where the ONO film C1 just below the memory gate electrode MG is excessively thick, writing speed would slow down, whereas, in a case where the ONO film C1 just below the memory gate electrode MG is excessively thin, retention characteristics (retention characteristics of information) deteriorate. In contrast, the film thickness of the ONO film C1 between the control gate electrode CG1 and the memory gate electrode MG does not significantly affect characteristics of the memory cell MC1.

Thus, the film thickness of the ONO film C1 just below the memory gate electrode MG significantly affects performance and reliability of the memory, whereby it is important that the semiconductor wafers WF are tested one by one and are evaluated to determine whether the film thickness of the ONO film C1 falls within a management value in the manufacturing process of the semiconductor device. Here, "management value" refers to an allowable value range of variations in the film thickness of the ONO film C1 determined at the designing stage.

Next, it is determined whether the film thickness of the ONO film C1 measured in the electrical test in step ST7 of FIG. 1 falls within the management value (step ST8 of FIG. 1). In practice, it is determined whether the value of the capacitance between the gate pattern G2 and the active region of the capacitor element CP shown in FIG. 15 falls within the management value. For example, in a case where an ideal value (median) for the film thickness of the ONO film C1 is 15 nm, the test result would be "pass" as long as the film thickness of the ONO film C1 measured in the electrical test in step ST7 falls within the management range (for example, a value within ±10% of 15 nm). However, if the value of the film thickness of the ONO film C1 fails to fall within ±10% of 15 nm, this result is fed back to step ST4 of FIG. 1 to adjust the condition for forming the ONO film C1 (step ST10 of FIG. 1). In other words, the condition for forming one of or a plurality of films among the silicon oxide films X1 and X2 or the silicon nitride film N1 configuring the ONO film C1 is adjusted. In addition, the semiconductor wafer WF having failed the test is discarded.

In this manner, if the result of capacitance management value determination in step ST8 of FIG. 1 is "fail", the condition for forming the ONO film C1 can be corrected in the process of preparing a new semiconductor wafer and manufacturing a semiconductor device based on the feedback result. Therefore, variations in the film thickness of the ONO film C1 can be suppressed, and adjustments such as bringing the median of the film thickness of the ONO film C1 close to the ideal value (such as 15 nm) can be performed. By managing and correcting the film thickness of the ONO film C1 based on the measurement result obtained in the electrical test in this manner, characteristics of the memory cell MC1 shown in FIG. 15 can be improved, whereby performance of the semiconductor device can be improved. Further, reliability and manufacturing yield of the semiconductor device can also be improved.

In practice, it is not only the measurement result of the capacitance that is fed back to the step (step ST4 of FIG. 1) of forming the ONO film C1. For example, the condition for forming the ONO film C1 is corrected by also taking into consideration the film thickness of each of the silicon oxide film X1, silicon nitride film N1 and silicon oxide film X2 measured by performing an optical test immediately after each of the silicon oxide film X1, silicon nitride film N1 and silicon oxide film X2 is formed (see FIG. 6).

If the result of capacitance management value determination in step ST8 of FIG. 1 is "pass", a further test is performed on the semiconductor wafer WF (step ST9 of FIG. 1). In a wafer test, a test is performed on whether the semiconductor device is able to operate normally.

Thereafter, the dicing process is performed on the semiconductor wafer WF having passed the wafer test. In other words, the scribe region 1D shown in FIG. 3 is cut along the extending direction of the scribe region 1D by a dicing blade to singulate the semiconductor wafer WF. By performing such a dicing process, a plurality of semiconductor chips CHP shown in FIG. 16 can be obtained from the semiconductor wafer WF.

In the dicing process, the center portion of the shorter direction of the scribe region 1D is cut. Namely, it is difficult to linearly and accurately cut a desired region, whereby a portion of the scribe region 1D spaced apart to some extent from the chip region CHR (see FIGS. 2 and 3) is cut. Therefore, a portion of the scribe region 1D remains in a peripheral portion of the singulated semiconductor chip CHP. At this time, there may be a case where the TEG region 1C remains in the scribe region 1D remaining in the peripheral portion of the semiconductor chip CHP, and it is conceivable that the capacitor element CP shown in FIG. 12 remains in the TEG region 1C.

<Operation of Memory Cell>

Next, an operation example of the memory cell (nonvolatile memory) will be described with reference to FIGS. 17 and 18.

Figure 17:
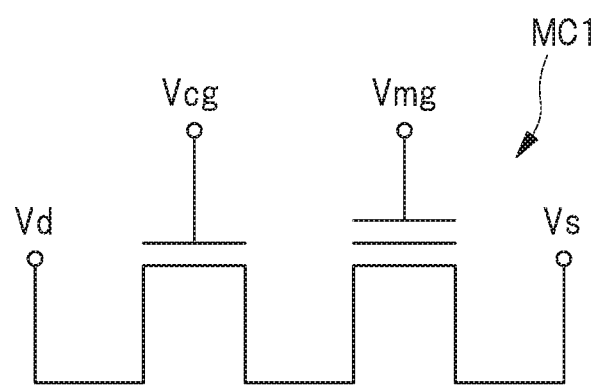
FIG. 17 is an equivalent circuit diagram of a memory cell of a nonvolatile memory.

FIG. 17 is an equivalent circuit diagram of the memory cell MC1 of the nonvolatile memory. FIG. 18 is a table showing an example of conditions in which voltage is applied to each portion of a selected memory cell at the time of "write", "erase" and "read". The table of FIG. 18 shows a voltage Vmg applied to the memory gate electrode MG (see FIG. 15) of the memory cell (selected memory cell) MC1 shown in FIG. 17, a voltage Vs applied to the source region, a voltage Vcg applied to the control gate electrode CG1 (see FIG. 15), a voltage Vd applied to the drain region and a voltage Vb applied to the p-type well PW at the times of "write", "erase" and "read". Note that the table of FIG. 18 shows a preferred example of the conditions in which voltage is applied. The conditions are not to be limited thereto and various modifications can be made as necessary.

In the present embodiment, injection of electrons into the silicon nitride film N1 (see FIG. 15) which is a charge storage unit in the ONO film C1 of the memory transistor is defined as "write", and injection of holes (electron holes) is defined as "erase".

For writing, the so-called SSI (Source Side Injection) method which is a writing method (hot electron injection writing method) in which writing is performed by injecting hot electrons by source side injection can be used. For example, writing is performed by applying a voltage as shown in the "write" column in FIG. 18 to each portion of the selected memory cell to which writing is performed and injecting electrons into the silicon nitride film configuring the ONO film C1 of the selected memory cell.

At this time, hot electrons are generated in a channel region (between the source and drain) below a region between the two gate electrodes (memory gate electrode MG and control gate electrode CG1), and the hot electrons are injected into the silicon nitride film which is a charge storage unit in the ONO film C1 below the memory gate electrode MG. The injected hot electrons (electrons) are trapped in a trap level in the silicon nitride film of the ONO film C1, and as a result, threshold voltage of the memory transistor is increased. Namely, the memory transistor is switched to a written state.

For erasing, the so-called BTBT (Band-To-Band Tunneling) method which is an erasing method (hot hole injection erasing method) in which erasing is performed by injecting hot holes by a BTBT phenomenon can be used. Namely, erasing is performed by injecting holes (electron holes) generated by the BTBT phenomenon into the charge storage unit (silicon nitride film N1 of ONO film C1). For example, by applying a voltage as shown in the "erase" column in FIG. 18 to each portion of the selected memory cell to which erase is performed such that holes (electron holes) are generated by the BTBT phenomenon and are accelerated with an electric field, the holes are injected into the silicon nitride film configuring the ONO film C1 of the selected memory cell, and as a result, threshold voltage of the memory transistor is reduced. Namely, the memory transistor is switched to an erased state.

Figures 18, 19:
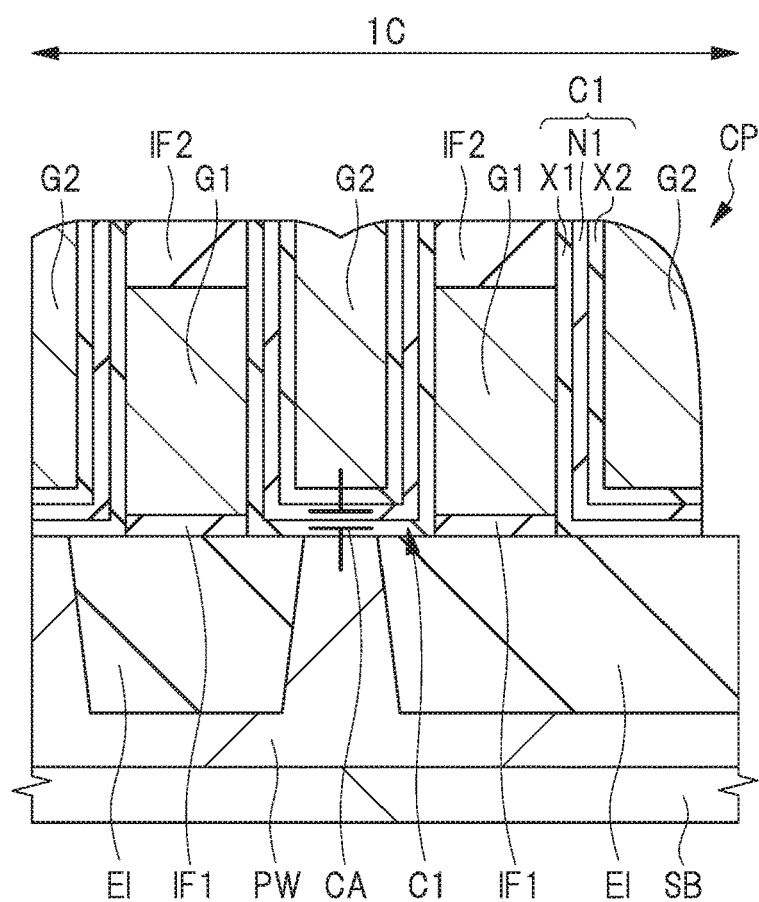
FIG. 18 is a table showing an example of conditions in which voltage is applied to each portion of a selected memory cell at the times of "write", "erase" and "read"
FIG. 19 is a cross-sectional view of the semiconductor device according to the first embodiment of the present invention.

At the time of reading, a voltage as shown in, for example, the "read" column in FIG. 18 is applied to each portion of the selected memory cell to which read is performed. By setting the voltage Vmg applied to the memory gate electrode MG at the time of reading to a value between a threshold voltage of the memory transistor in the written state and a threshold voltage of the memory transistor in the erased state, it is possible to distinguish between the written state and the erased state.

<Effects of Present Embodiment>

Figure 35:
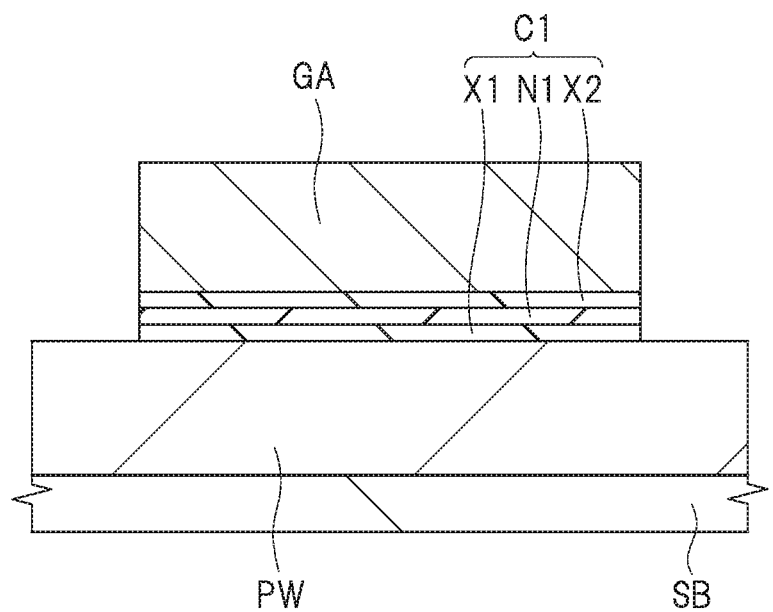
FIG. 35 is a cross-sectional view of a semiconductor device according to a comparative example in a manufacturing process.
Figure 36:
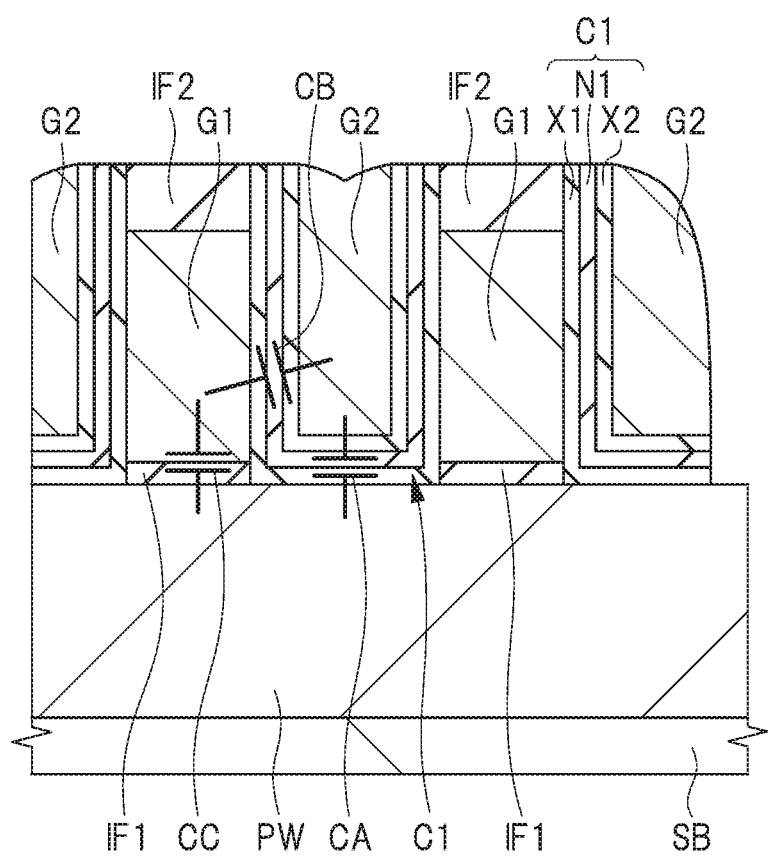
FIG. 36 is a cross-sectional view of the semiconductor device according to the comparative example in the manufacturing process.

Effects of the present embodiment will be described with reference to FIGS. 19, 35 and 36. FIG. 19 is a cross-sectional view showing an enlarged portion of the semiconductor device of the present embodiment. FIGS. 35 and 36 are cross-sectional views each showing a semiconductor device according to a comparative example.

An example of a method of testing and managing the film thickness of the ONO film which is a charge storage unit of the memory cell of the MONOS memory during the manufacturing process includes a method in which a capacitor element comprising two electrodes insulated from each other by the ONO film is formed in the TEG region, and the charge of the capacitor element is measured to calculate the film thickness of the ONO film. As a configuration of the capacitor element, it is conceivable to form, for example, a gate pattern GA which is an upper electrode on the semiconductor substrate SB which is a lower electrode via the ONO film C1, as shown in FIG. 35. In this case, the ONO film C1 and the gate pattern GA are formed in the same step as the step of forming the ONO film and the memory gate electrode formed in the memory cell region.

However, in the capacitor element (TEG) of the comparative example shown in FIG. 35, it would be necessary to pattern a conductive film such as a polysilicon film and prepare a photomask (reticle) exclusively for forming the gate pattern GA. Preparing the photomask to be used in the photolithography technique and performing exposure and development processes with using the photomask causes an increase in the manufacturing cost of the semiconductor device. In a case where the memory gate electrode is formed beside the control gate electrode in a self-aligning manner as in the above-described embodiment, there is no need to prepare a photomask for patterning the memory gate electrode, whereby it is advantageous in that the manufacturing cost of the semiconductor device can be reduced.

As a capacitor element for testing the film thickness of the ONO film without impairing this advantage, a capacitor element as shown in FIG. 36 can be considered. The capacitor element of the comparative example shown in FIG. 36 is similar to that of the present embodiment in that it has the gate pattern G1 and the gate pattern G2. However, the comparative example differs from the present embodiment in that the active region is formed just below the gate pattern G1. In other words, in FIG. 36, the gate pattern G1 is formed on the active region of the upper surface of the semiconductor substrate SB via the insulating film IF1, and a plurality of stacked patterns constituted by the insulating film IF1 and the gate pattern G1 are arranged side-by-side in a horizontal direction. The gate pattern G2 is buried between the gate patterns G1 adjacent to each other via the ONO film C1. The gate pattern G1 is formed in the same step as the step of forming the control gate electrode in the memory cell region, and the ONO film C1 and the gate pattern G2 are formed in the same step as the step of forming the ONO film and the memory gate electrode in the memory cell region.

In the comparative example, it appears that the film thickness of the ONO film C1 can be measured by measuring capacitance between the gate pattern G2 and the active region. In other words, by measuring only the capacitance CA shown in FIG. 36, the film thickness of the ONO film C1 just below the gate pattern G2 can be measured. In practice, however, even if the gate pattern G1 is, for example, in an electrically floating state, a capacitance CB is generated between the gate pattern G1 and the gate pattern G2, and a capacitance CC is generated between the active region of the upper surface of the semiconductor substrate SB and the gate pattern G1 just above the active region. Thus, when attempting to measure the capacitance between the active region and the gate pattern G2, the capacitances CB and CC connected in parallel to the capacitance CA and connected in series with each other are measured in addition to the capacitance CA. In other words, in the comparative example, it is not possible to measure only the capacitance CA.

As described above, the film thickness of the ONO film just below the memory gate electrode significantly affects characteristics of the split-gate type MONOS memory, but the film thickness of the ONO film between the control gate electrode and the memory gate electrode does not significantly affect performance and reliability of the MONOS memory. In contrast, in the capacitor element of the comparative example shown in FIG. 36, the capacitances CB and CC are always measured in addition to the capacitance CA.

In addition, the film thickness of the ONO film C1 formed on the side surface of the gate pattern made of, for example, a polysilicon film and the film thickness of the ONO film C1 formed on the upper surface of the semiconductor substrate made of, for example, single crystal silicon usually do not have the same thicknesses. In particular, the bottom oxide film formed on the side surface of the gate pattern by the oxidation method or the like is more likely to have a greater film thickness than the bottom oxide film formed on the upper surface of the semiconductor substrate SB, whereby the film thickness is likely to vary. In addition, in a case where a height of the gate pattern G1 varies, the capacitance CB is caused to vary as well.

Thus, there is a problem in that the thickness of the ONO film between the memory gate electrode and the semiconductor substrate in the memory cell region cannot be accurately measured and that performance and reliability of the memory cell cannot be evaluated.

Thus, in the present embodiment, the element isolation region EI is formed just below the gate pattern G1, as shown in FIG. 13. In this manner, the capacitance CC (see FIG. 36) is prevented from being generated between the gate pattern G1 and the semiconductor substrate SB when performing the electrical test (step ST7 of FIG. 1).

Namely, in the present embodiment, the memory cell MC1 of the split-gate type MONOS memory is formed in the memory cell region 1B. Here, the memory gate electrode MG is formed on the side surface of the control gate electrode CG1 in a self-aligning manner via the ONO film C1, whereby preparing a photomask for processing the memory gate electrode MG can be omitted and the manufacturing cost of the semiconductor device can be reduced. Here, the gate pattern G2 is formed to be buried between the gate patterns G1 adjacent to each other such that a photomask does not need to be used when forming the gate pattern G2. In this manner, each of the gate patterns G1 and G2 in the TEG region 1C can be formed during the steps of manufacturing each of the control gate electrode CG1 and memory gate electrode MG. Thus, the manufacturing process of the semiconductor device can be shortened as compared to a case where the gate pattern G2 and the memory gate electrode MG are formed in separate steps, whereby the manufacturing cost of the semiconductor device can be reduced.

In order to simplify the manufacturing process as described above, the gate patterns G1 and G2 adjacent to each other are formed in the TEG region 1C. However, the gate pattern G1 is an electrode that is not used in the electrical test using the TEG. In contrast, the active region in the TEG region 1C overlaps only the gate pattern G2 and does not overlap the gate pattern G1 in plan view. In other words, in the present embodiment, the element isolation region EI is formed just below the gate pattern G1 to prevent capacitance from being generated between the semiconductor substrate SB and the gate pattern G1 that is not used in the electrical test. In this manner, in the electrical test performed for measuring the film thickness of the ONO film C1, it is possible to measure only the capacitance CA (see FIG. 19) between the gate pattern G2 and the semiconductor substrate SB.

In addition, as shown in FIG. 19, the upper surface (active region) of the semiconductor substrate SB defined by the element isolation region EI overlaps only the gate pattern G2 in plan view, whereby the width of the active region in the lateral direction is made to be smaller than the width of the gate pattern G2 in the lateral direction.

Therefore, it is possible to prevent capacitances CB and CC (see FIG. 36) which are two capacitances connected in series with each other between the gate pattern G2 and the semiconductor substrate SB from being unnecessarily measured when performing electrical measurement. In addition, the capacitance CB between the gate patterns G1 and G2 is not measured when measuring the capacitance CA between the gate pattern G2 and the semiconductor substrate SB, whereby it is possible to prevent variations in measurement values of the capacitance caused by variations in the film thickness of the ONO film C1 formed on the side surface of the gate pattern G1 and by variations in height of the control gate electrode CG1.

In the present embodiment, it is thus possible to measure only the film thickness of the ONO film C1 just below the gate pattern G2 which is a portion relating to characteristics of the MONOS memory, whereby it is possible to accurately evaluate by the electrical test. Namely, reliability of the semiconductor device can be improved.

Modification Example

Figure 20:
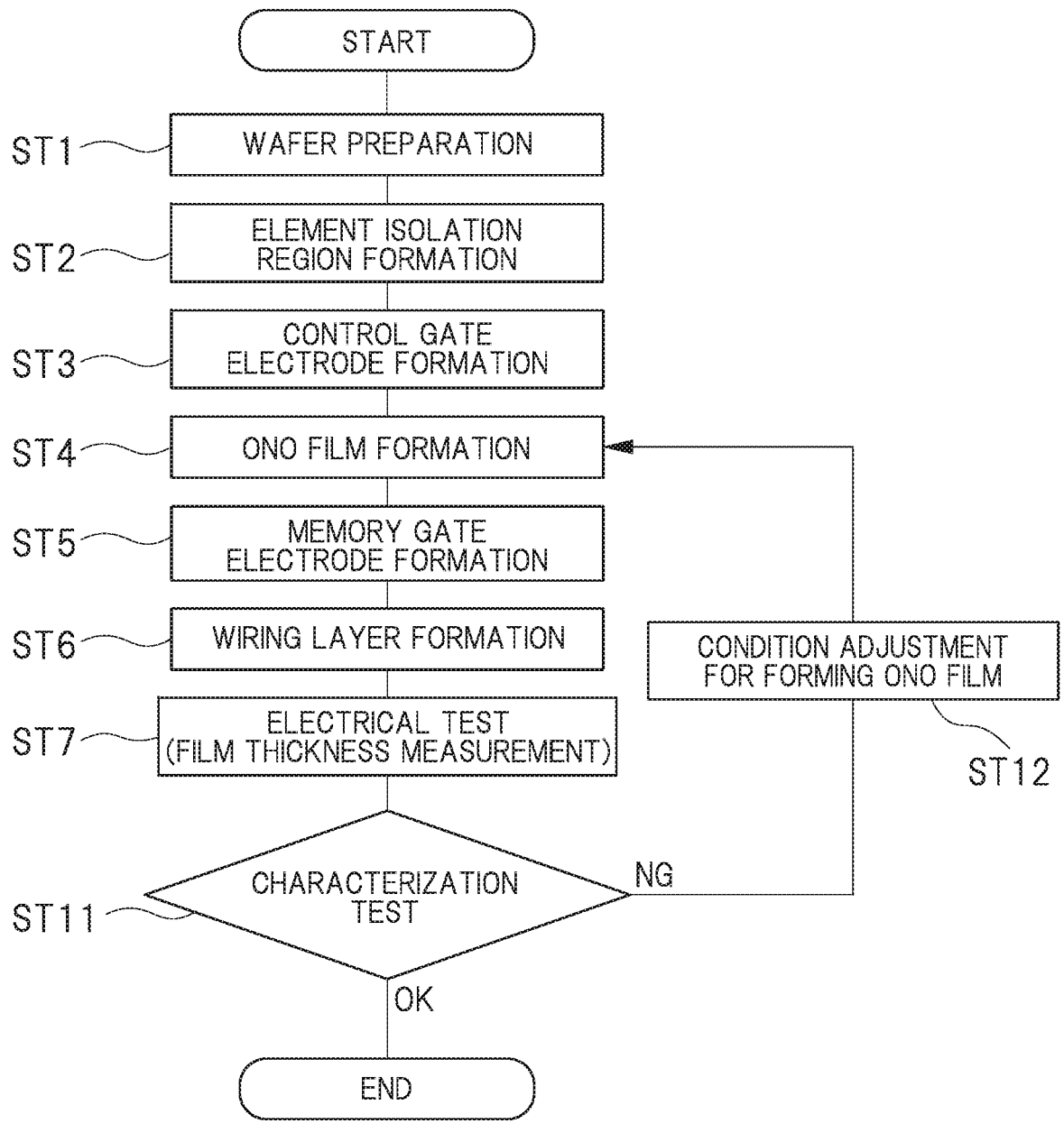
FIG. 20 is a flowchart describing a manufacturing process of a semiconductor device according to a modification example of the first embodiment of the present invention.

The TEG of the present embodiment can be used not only when managing the film thickness of the ONO film but also when determining the film thickness of the ONO film in the designing stage. Hereinafter, a configuration in which the electrical test is performed by using the capacitor element which is a TEG and the management value for the film thickness of the ONO film is determined based on the result will be described with reference to FIG. 20. FIG. 20 is a flowchart describing the manufacturing process of the semiconductor device according to the modification example of the first embodiment.

In the modification example, in order to determine the film thickness of the ONO film of the split-gate type MONOS memory, a semiconductor device including the TEG at the designing stage of the semiconductor device is manufactured, and the film thickness of the ONO film is measured by using the capacitor element in the TEG region. Specifically, the semiconductor wafer on which a relatively thick ONO film is formed and a semiconductor wafer on which a relatively thin ONO is formed are prepared, a characterization test is performed on the memory cell formed in each of the semiconductor wafers, and the management value (median and management range) for the film thickness of the ONO film is determined based on the result.

Here, in order to determine an upper limit of the management value, the memory cell including the relatively thick ONO film is first formed on a first semiconductor wafer, and the characterization test is performed on the first semiconductor wafer. In other words, as described with reference to FIGS. 2 and 3, the first semiconductor wafer is prepared (step ST1 of FIG. 20). Subsequently, as described with reference to FIG. 4, the element isolation region EI is formed (step ST2 of FIG. 20). Subsequently, as described with reference to FIG. 5, the control gate electrode CG1 and the gate pattern G1 are formed (step ST3 of FIG. 20). Subsequently, as described with reference to FIGS. 6 and 7, the ONO film, the memory gate electrode MG and the gate pattern G2 are formed (steps ST4 and ST5 of FIG. 20). Subsequently, as described with reference to FIGS. 8 to 15, the memory cell MC1 in the memory cell region 1B and the transistor Q1 and the wiring layer in the logic circuit region 1A are formed (step ST6 of FIG. 20). The steps in the modification example up to this point are the same as those described with reference to FIGS. 1 to 15, and the configuration of the capacitor element CP formed in the TEG region 1C is the same as that shown in FIGS. 12 and 15.

Next, the electrical test is performed by using the capacitor element CP in the TEG region 1C shown in FIG. 15 to measure the film thickness of the ONO film C1 (step ST7 of FIG. 20). Namely, by generating a potential difference between the gate pattern G2 which is an upper electrode and the active region of the semiconductor substrate SB which is a lower electrode and measuring the electrostatic capacitance between the upper electrode and the lower electrode at this time, the film thickness of the ONO film C1 can be measured. Here, the film thickness of the ONO film C1 on the first semiconductor wafer is, for example, 16.2 nm.

Next, the characterization test is performed by the wafer test (step ST11 of FIG. 20). In the characterization test, characterization of the memory cell (such as writing speed, life span or retention characteristics) is performed. If there is no problem in the test result, the film thickness of the ONO film C1 can be set as the upper limit of the management value. However, if there is a problem in the characterization test result, another semiconductor wafer is used, and steps ST1 to ST11 of FIG. 20 are repeated. At this time, the condition for forming the ONO film C1 is corrected to adjust the film thickness of the ONO film C1 to be thinner than 16.2 nm (step ST12 of FIG. 20). In other words, the test result is fed back to the step (step ST4 of FIG. 20) of forming the ONO film C1. By repeating steps ST1 to ST11 of FIG. 20 in this manner, a boundary of the film thickness of the ONO film C1 at which the result of the characterization test splits between "pass" and "fail" is determined. This film thickness becomes the upper limit of the management value for the film thickness of the ONO film C1.

Next, in order to determine a lower limit of the management value, the memory cell including the relatively thin ONO film is formed on the first semiconductor wafer, and the characterization test is performed on the first semiconductor wafer. In other words, a second semiconductor wafer is prepared (step ST1 of FIG. 20). Thereafter, steps ST2 to ST6 of FIG. 20 are performed to form the semiconductor device.

Next, the electrical test is performed by using the capacitor element CP in the TEG region 1C shown in FIG. 15 to measure the film thickness of the ONO film C1 (step ST7 of FIG. 20). Here, the film thickness of the ONO film C1 on the first semiconductor wafer is, for example, 13.8 nm.

Next, the characterization test is performed by the wafer test (step ST11 of FIG. 20). If there is no problem in the test result, the film thickness of the ONO film C1 can be set as the lower limit of the management value. However, if there is a problem in the characterization test result, another semiconductor wafer is used, and steps ST1 to ST11 of FIG. 20 are repeated. At this time, the condition for forming the ONO film C1 is corrected to adjust the film thickness of the ONO film C1 to be thicker than 13.8 nm (step ST12 of FIG. 20). In other words, the test result is fed back to the step (step ST4 of FIG. 20) of forming the ONO film C1. By repeating steps ST1 to ST11 of FIG. 20 in this manner, a boundary of the film thickness of the ONO film C1 at which the result of the characterization test splits between "pass" and "fail" is determined. This film thickness becomes the lower limit of the management value for the film thickness of the ONO film C1.

As described above, the characterization test is performed on each of the semiconductor wafer on which a relatively thick ONO film is formed and the semiconductor wafer on which a relatively thin ONO film is formed, and the upper limit, the lower limit and the median of the management value for the film thickness of the ONO film are determined based on the results. Note that the median does not need to be in the middle of the upper limit film thickness and the lower limit film thickness. In practice, the condition for forming the ONO film is determined not only by the film thickness calculated from the capacitance value obtained from the result of the electrical test (step ST7 of FIG. 20) but also is adjusted while taking into consideration the film thickness measured by an optical test performed immediately after forming the silicon oxide film and the silicon nitride film configuring the ONO film.

After the management value for the ONO film is determined in the designing stage as described above, steps ST1 to ST9 described with reference to FIG. 1 are performed to complete the semiconductor device according to the modification example. Note that the feature of the modification example is that the management value and the median for the ONO film are determined by using the capacitor element CP in the TEG region 1C shown in FIG. 15. Therefore, when performing steps ST1 to ST9 of FIG. 1 to manufacture the semiconductor device of the modification example, the capacitor element CP formed in the TEG region 1C in the steps described with reference to FIGS. 2 to 15 may or may not be used in determining the capacitance management value (step ST8 of FIG. 1).

Hereinafter, effects of the modification example will be described.

In the modification example, the film thickness of the ONO film of the memory cell used in the characterization test performed to determine the management value and the median for the ONO film in the designing stage is measured by using the capacitor element CP shown in FIGS. 12 and 15. Here, the element isolation region EI is formed just below the gate pattern G1 shown in FIG. 15. In this manner, it is possible to prevent capacitances CB and CC (see FIG. 36) which are two capacitances connected in series with each other between the gate pattern G2 and the semiconductor substrate SB from being unnecessarily measured when electrically measuring the film thickness. Thus, measurement by the electrical test can be accurately performed. Further, the management value for the film thickness of the ONO film in which reliability of the semiconductor device can be maintained can be accurately determined. Namely, reliability of the semiconductor device can be improved.

Second Embodiment

In a second embodiment, an example in which the present invention is applied to a semiconductor device formed by the so-called gate-last process and to a manufacturing method thereof will be described with reference to FIGS. 21 to 27. The gate-last process is a manufacturing method in which a dummy gate electrode and source/drain regions are formed, and then, the dummy gate electrode is replaced with a metal film (metal gate electrode). FIGS. 22 to 27 are cross-sectional views of the semiconductor device of the present embodiment in the manufacturing process. Here, the semiconductor device is manufactured according to the flowchart shown in FIG. 21.

In the manufacturing process of the semiconductor device of the present embodiment, the semiconductor wafer (semiconductor substrate) WF is first prepared as in the steps described with reference to FIGS. 2 and 3 (step ST21 of FIG. 21). Next, as in the steps described with reference to FIG. 4, the element isolation region EI is formed in the main surface of the semiconductor substrate SB (step ST22 of FIG. 21).

Next, the same steps as those described with reference to FIG. 5 are performed. In this manner, in the logic circuit region 1A, the insulating film IF1, the polysilicon film P1 and the insulating film IF2 are stacked over the semiconductor substrate SB in this order. In addition, in the memory cell region 1B, a stacked pattern constituted by the insulating film IF1, a dummy gate electrode (dummy gate pattern) DG2 made of the polysilicon film P1, and the insulating film IF2 stacked over the semiconductor substrate SB in this order is formed. The material and shape of the stacked pattern are the same as those of, for example, the stacked pattern constituted by the gate insulating film GF1, the control gate electrode CG1 and the insulating film IF2 shown in the memory cell region 1B of FIG. 5. In addition, in the TEG region 1C, a plurality of stacked patterns constituted by the insulating film IF1, a dummy gate electrode (dummy gate pattern) DG1 made of the polysilicon film P1, and the insulating film IF2 stacked over the semiconductor substrate SB in this order are formed side-by-side. The material and shape of the stacked patterns are the same as those of, for example, the stacked pattern constituted by the insulating film IF1, the gate pattern G1 and the insulating film IF2 shown in the TEG region 1C of FIG. 5.

Figure 21:
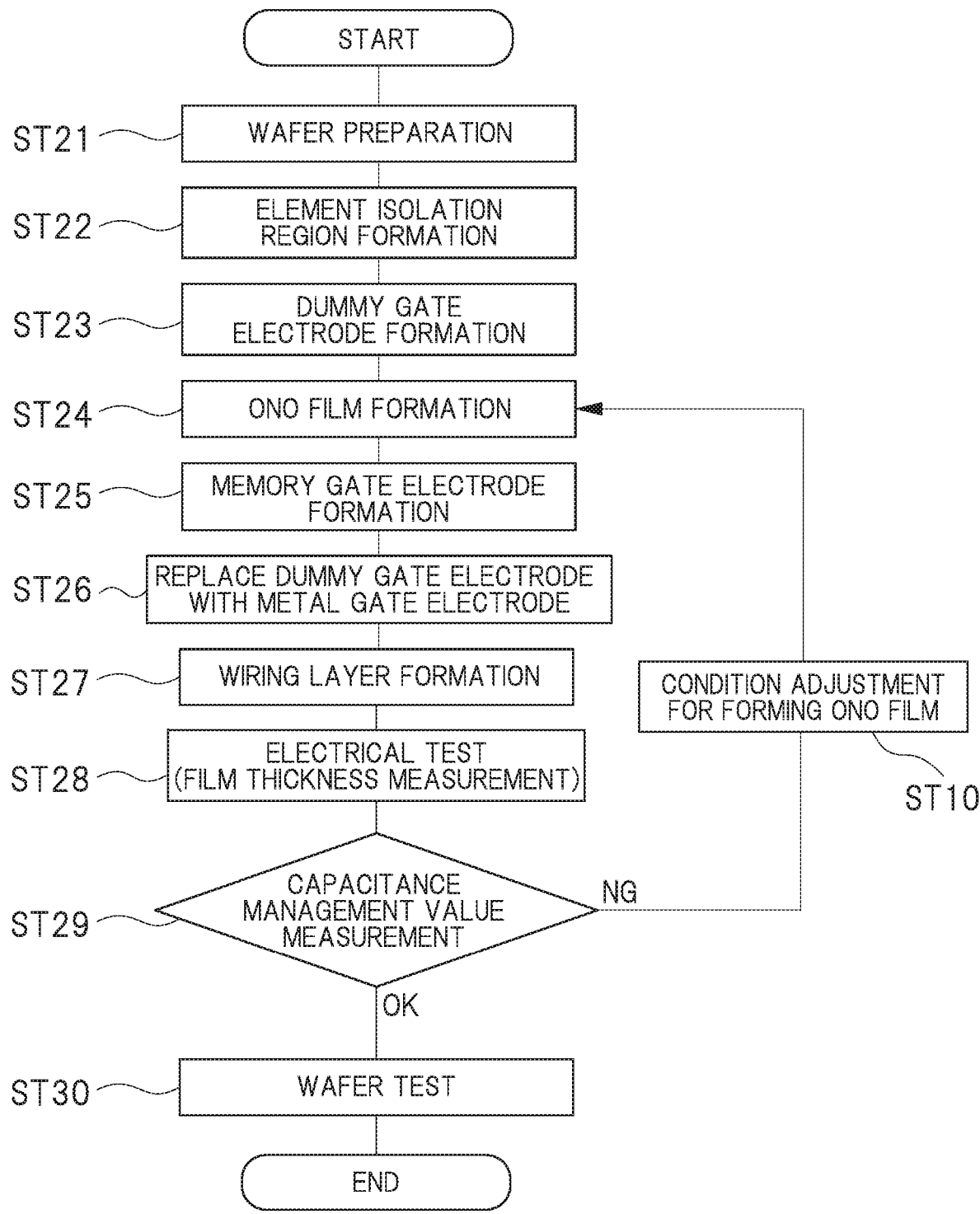
FIG. 21 is a flowchart describing a manufacturing process of a semiconductor device according to a second embodiment of the present invention.

In this manner, the dummy gate electrodes DG1 and DG2 are formed (step ST23 of FIG. 21). Here, unlike the first embodiment these portions are not referred to as the gate insulating film GF1, the control gate electrode CG1 or the gate pattern G1 (see FIG. 5). However, the manufacturing process performed up to this point is the same as that of the first embodiment. In other words, the dummy gate electrode DG1 is formed just above the element isolation region EI in the TEG region 1C, and the upper surface of the semiconductor substrate SB between the dummy gate electrodes DG1 adjacent to each other in the X direction is exposed from the element isolation regions EI.

Next, the same steps as those described with reference to FIG. 6 are performed. In other words, the ONO film C1 is formed (step ST24 of FIG. 21), and the polysilicon film P2 is formed on the ONO film C1.

Figure 22:
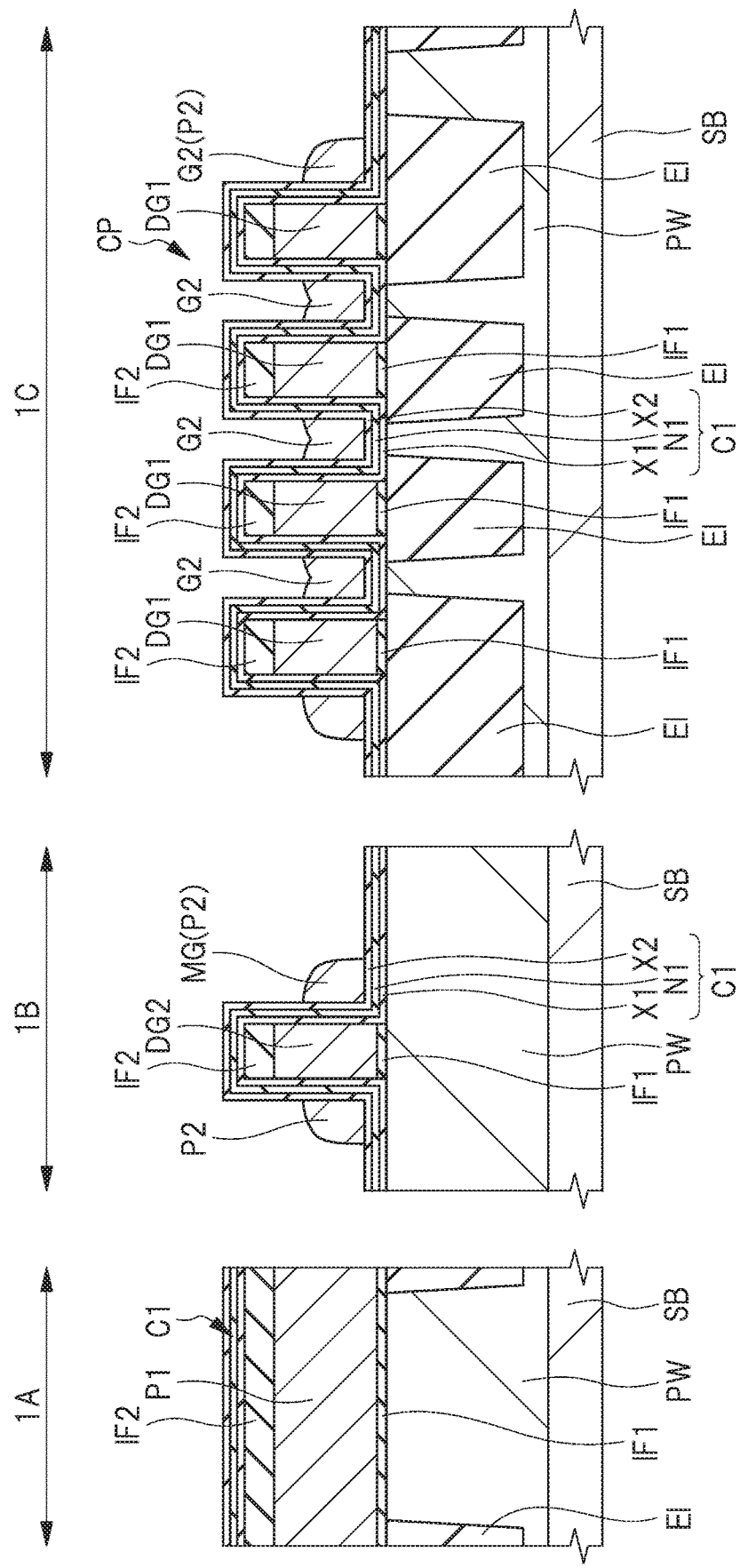
FIG. 22 is a cross-sectional view of the semiconductor device according to the second embodiment of the present invention in the manufacturing process.

Next, as shown in FIG. 22, the same steps as those described with reference to FIG. 7 are performed. In other words, the polysilicon film P2 is etched back such that the upper surface of the insulating film IF2 and a portion of the upper surface of the semiconductor substrate SB are exposed from the polysilicon film P2. In this manner, the memory gate electrode MG made of the polysilicon film P2 is formed on one of the side surfaces of the dummy gate electrode DG2 in the memory cell region 1B (step ST25 of FIG. 21). In addition, a plurality of the gate patterns G2 made of the polysilicon film P2 are formed in the TEG region 1C. The gate pattern G2 is buried between the dummy gate electrodes DG1 adjacent to each other in the X direction, and is formed just above the active region.

However, unlike the first embodiment, the upper surface of each of the memory gate electrode MG and gate pattern G2 is set at a lower position. Specifically, etch back is performed such that the upper surface of each of the memory gate electrode MG and gate pattern G2 is located at a lower position than the upper surface of each of the dummy gate electrodes DG1 and DG2. This is done to prevent the memory gate electrode MG and the gate pattern G2 from being replaced with a metal gate electrode when replacing the control gate electrode and the gate electrode in the logic circuit region 1A with the metal gate electrode in subsequent steps.

Figure 23:
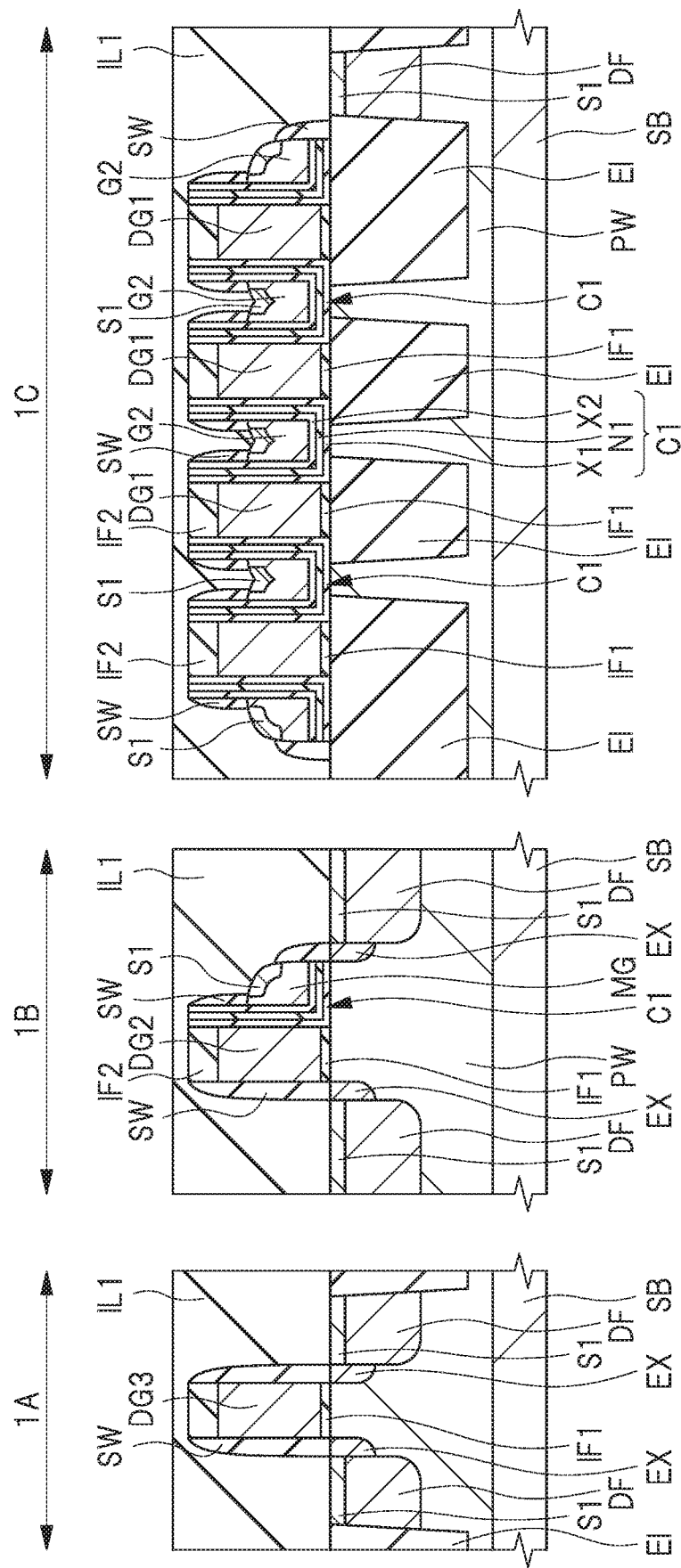
FIG. 23 is a cross-sectional view of the semiconductor device in the manufacturing process continued from FIG. 22.

Next, as shown in FIG. 23, the same steps as those described with reference to FIGS. 8 to 11 are performed. In other words, the polysilicon film P2 adjacent to one of the side surfaces of the dummy gate electrode DG2 is removed, and thereafter, the ONO film C1 exposed from the memory gate electrode MG and the gate pattern G2 is removed. Subsequently, in the logic circuit region 1A, the insulating film IF2, the polysilicon film P1 and the insulating film IF1 are patterned to form a dummy gate electrode DG3 made of the polysilicon film P1. A material and shape of the dummy gate electrode DG3 are the same as those of the gate electrode GE1 shown in FIG. 9.

Subsequently, the extension region EX, the sidewall spacer SW and the diffusion region DF are formed. Here, the sidewall spacer SW is also formed in a region adjacent to a side surface of a stacked pattern including the dummy gate electrode DG2 and the insulating film IF2 and being located above the memory gate electrode MG. Likewise, the sidewall spacer SW is formed in a region adjacent to a side surface of a stacked pattern including the dummy gate electrode DG1 and the insulating film IF2 and being located above the gate pattern G2. Subsequently, the silicide layer S1 is formed by using the salicide technique.

Figure 24:
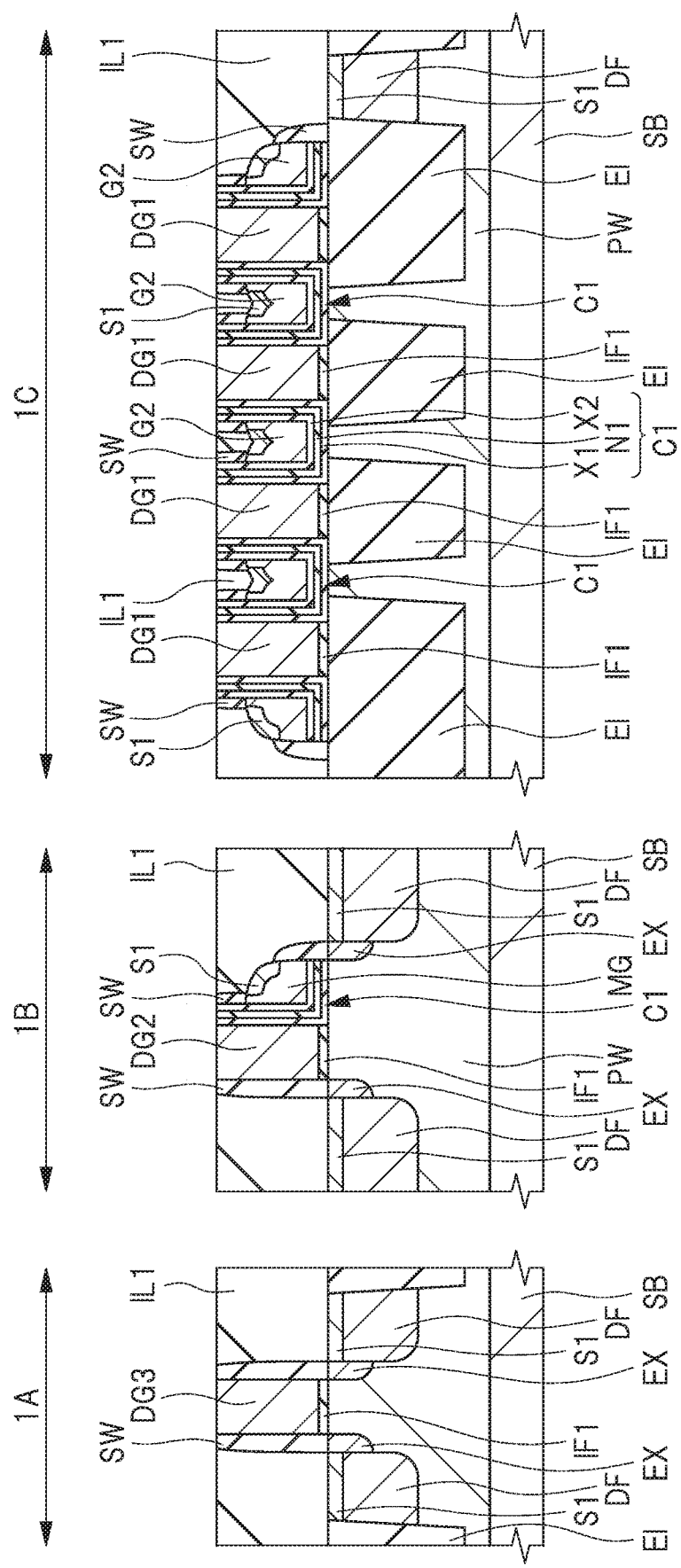
FIG. 24 is a cross-sectional view of the semiconductor device in the manufacturing process continued from FIG. 23.

Next, as shown in FIG. 24, after the interlayer insulating film IL1 is formed on the semiconductor substrate SB by using, for example, the CVD method, polishing is performed by, for example, the CMP method to planarize the upper surface of the interlayer insulating film IL1. In this manner, the insulating film IF2 is removed to expose the upper surface of each of the dummy gate electrodes DG1 to DG3. However, the memory gate electrode MG, the gate pattern G2 and the silicide layer S1 are not exposed from the interlayer insulating film IL1 in this polishing process.

Figure 25:
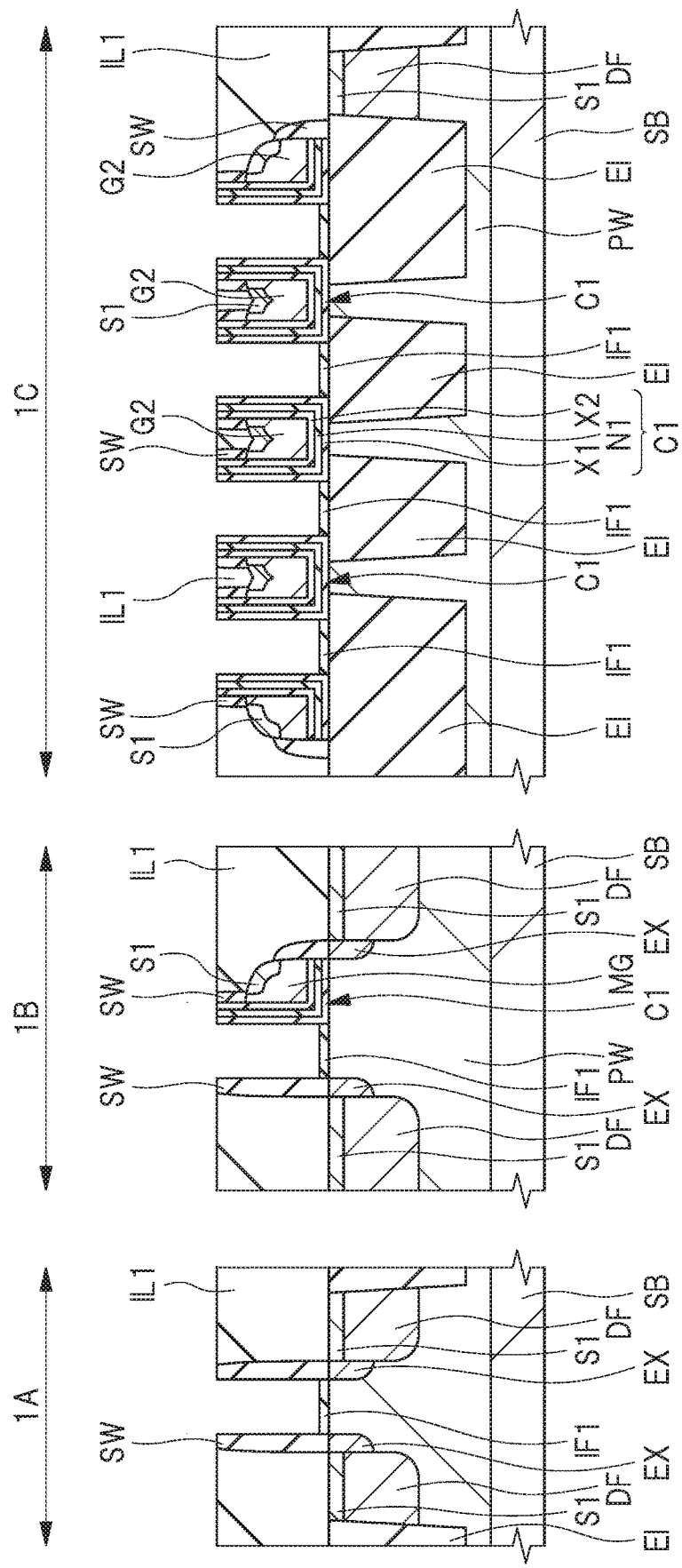
FIG. 25 is a cross-sectional view of the semiconductor device in the manufacturing process continued from FIG. 24.

Next, as shown in FIG. 25, the dummy gate electrodes DG1 to DG3 are removed by performing, for example, wet etching. In this manner, a trench is formed in each of the regions from which the dummy gate electrodes DG1 to DG3 have been removed. In the TEG region 1C, the trench is formed just above the element isolation region EI, and the gate pattern G2 just above the active region is not removed. Note that the insulating film IF1 below each of the dummy gate electrodes DG1 to DG3 may or may not be removed.

Figure 26:
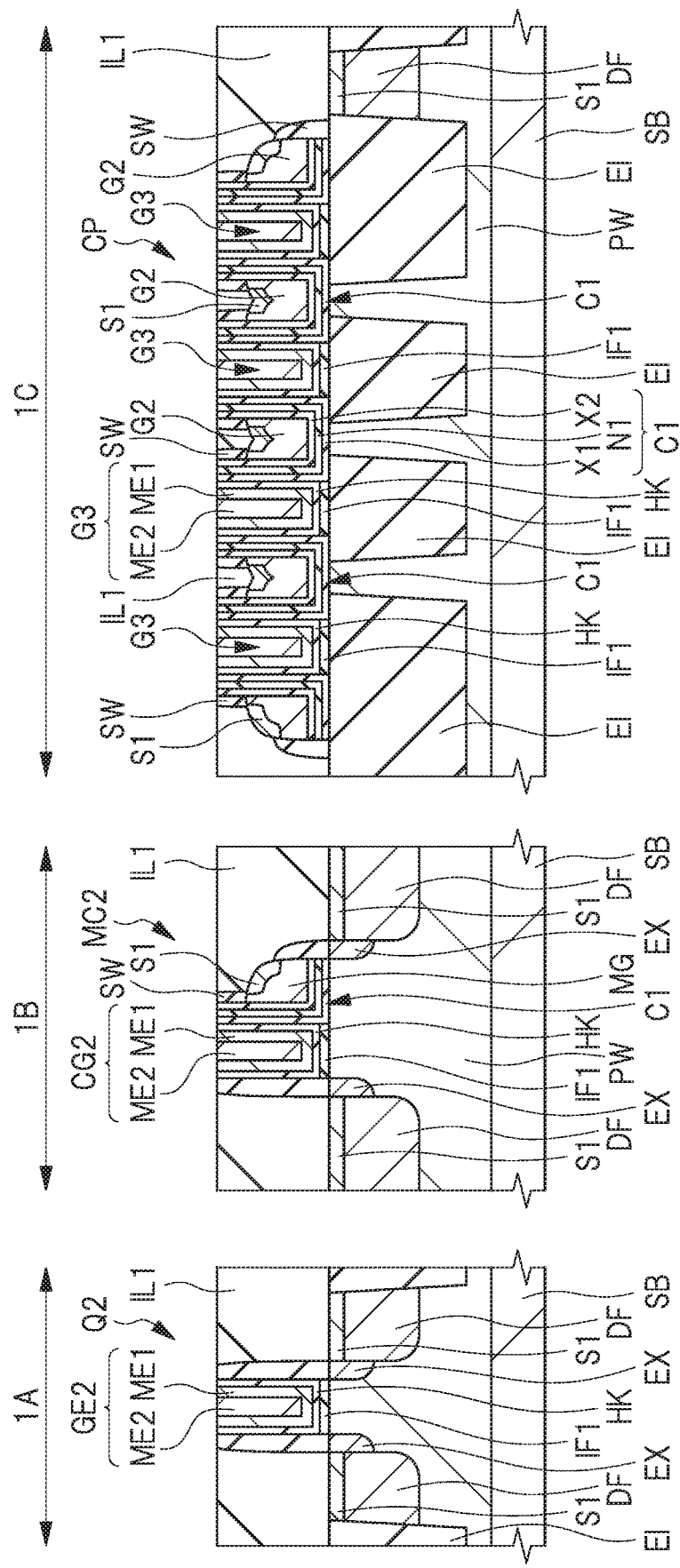
FIG. 26 is a cross-sectional view of the semiconductor device in the manufacturing process continued from FIG. 25.

Next, as shown in FIG. 26, an insulating film HK, metal films ME1 and ME2 are stacked over the semiconductor substrate SB including the trench in this order. In this manner, the trench is completely filled. The insulating film HK is the so-called high-k film having a higher permittivity (relative permittivity) than silicon oxide and silicon nitride. For the insulating film HK, a metal oxide film such as a hafnium oxide film, a zirconium oxide film, an aluminum oxide film, a tantalum oxide film, a lanthanum oxide film or the like can be used. The insulating film HK can be formed by, for example, the ALD (Atomic layer Deposition) method or the like. A film thickness of the insulating film HK is, for example, 1.5 nm. In a case where a high permittivity film (here, the insulating film HK) is used for the gate insulating film, the physical film thickness of the gate insulating film can be increased as compared to a case where a silicon oxide film is used, whereby it is possible to obtain an advantage in which lead current can be reduced.

For the metal films ME1 and ME2, a metal film such as a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbonitride (TaCN) film, a titanium (Ti) film, a tantalum (Ta) film, a titanium aluminide (TiAl) film, an aluminum (Al) film or the like can be used. Here, "metal film" refers to a conductor film showing metal conduction and includes a metal compound film showing metal conduction in addition to a single metal film (pure metal film) and an alloy film. The metal film can be formed by using, for example, the sputtering method or the like.

Here, for example, the metal film ME1 is formed by a titanium nitride (TiN) film, and the metal film ME2 on the titanium nitride film is formed by an aluminum (Al) film. At this time, it is preferable that the aluminum film is thicker than the titanium nitride film. The aluminum film has low resistance such that the resistance of the gate electrode to be formed in subsequent steps can be reduced.

Subsequently, the excessive metal films ME1 and ME2 and the excessive insulating film HK outside the trench are polished by the CMP method or the like to be removed such that the insulating film HK and the metal films ME1 and ME2 remain in the trench. The metal film ME1 is formed so as to cover side and lower surfaces of the metal film ME2 and has a U-shaped cross section. In addition, the insulating film HK on the insulating film IF1 is formed so as to cover side and lower surfaces of the metal film ME1 and has a U-shaped cross section.

Namely, in the logic circuit region 1A, a gate electrode GE2 made of the metal films ME1 and ME2 is formed in the trench which is a portion from which the dummy gate electrode DG3 has been removed. The gate electrode GE2 and the source/drain regions in the logic circuit region 1A configure a transistor Q2. The insulating films IF1 and HK below the gate electrode GE2 configure a gate insulating film of the transistor Q2.

In addition, in the memory cell region 1B, a control gate electrode CG2 made of the metal films ME1 and ME2 is formed in the trench which is a portion from which the dummy gate electrode DG2 has been removed. The control gate electrode CG2 and the source/drain regions in the memory cell region 1B configure a control transistor. The memory gate electrode MG and the source/drain regions in the memory cell region 1B configure a memory transistor. The control transistor and the memory transistor configure a memory cell MC2. The insulating films IF1 and HK below the control gate electrode CG2 configure a gate insulating film of the control transistor.

In addition, in the TEG region 1C, a gate pattern G3 made of the metal films ME1 and ME2 is formed in the trench which is a portion from which the dummy gate electrode DG1 has been removed. In other words, in the TEG region 1C, a plurality of gate patterns G3 extending in the Y direction are formed side-by-side in the X direction, and the gate pattern G2 is buried between the gate patterns G3 adjacent to each other in the X direction. The active region which is a portion of the upper surface of the semiconductor substrate SB exposed from the element isolation regions EI and the gate pattern G2 formed just above the active region via the ONO film C1 configure the capacitor element CP. A planar layout of the gate pattern G3 is the same as that of the control gate electrode CG1 shown in FIG. 12.

Thus, the dummy gate electrodes DG1 to DG3 are each replaced with the metal gate electrode in the steps described with reference to FIGS. 24 to 26 (step ST26 of FIG. 21).

Figure 27:
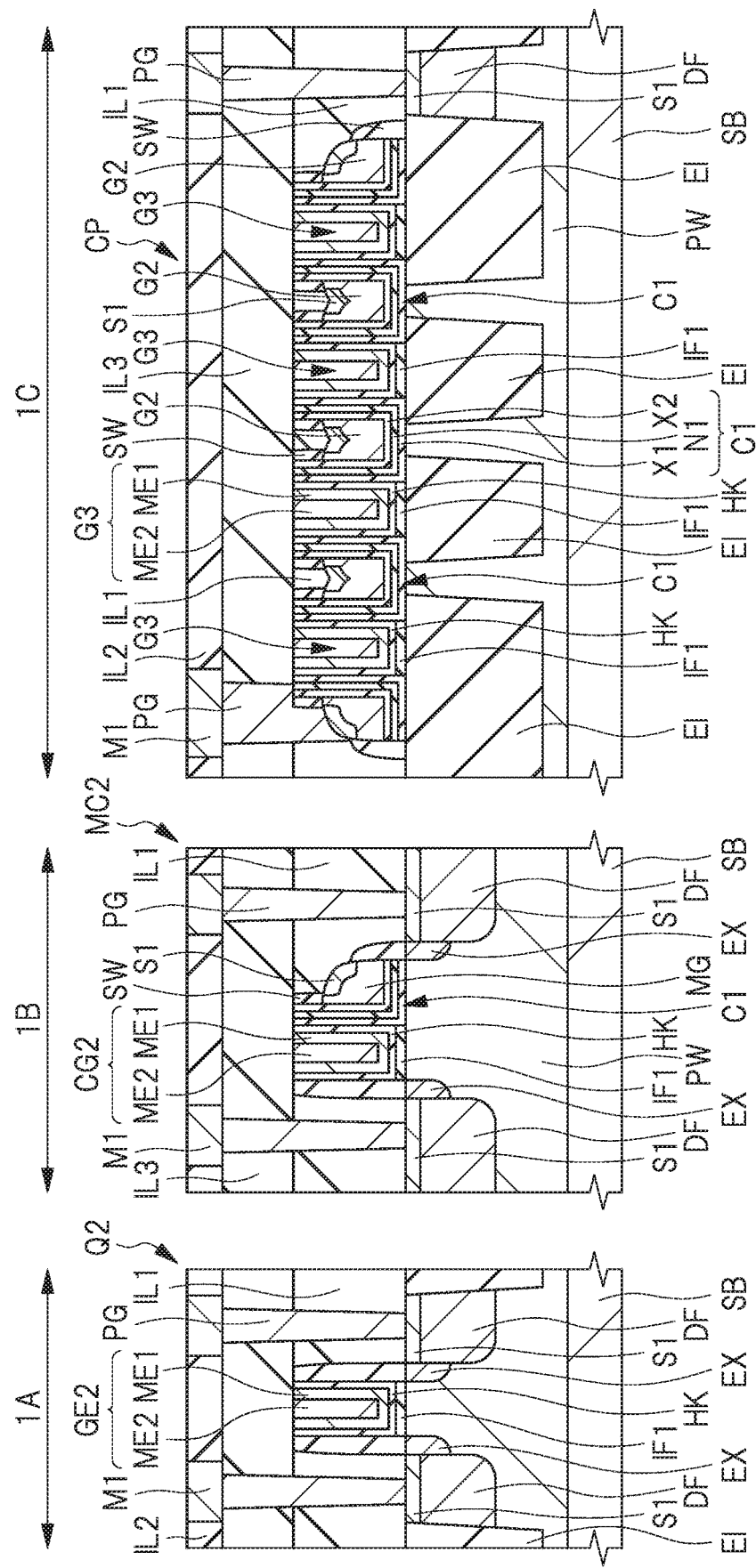
FIG. 27 is a cross-sectional view of the semiconductor device in the manufacturing process continued from FIG. 26.

Next, as shown in FIG. 27, an interlayer insulating film IL3 made of, for example, a silicon oxide film is formed on each of the interlayer insulating film IL1, gate electrode GE2, control gate electrode CG2 and gate pattern G3 by using, for example, the CVD method.

Subsequently, the same steps as those described with reference to FIGS. 12 to 15 are performed to form the wiring layer (step ST27 of FIG. 21). Namely, the plurality of plugs PG penetrating the interlayer insulating film IL3 and the interlayer insulating film IL1 are formed. Here, the plug PG connected to each of the memory gate electrode MG and gate pattern G2 is not shown. In a region not shown, a plug penetrating the interlayer insulating film IL3 and being connected to the gate electrode GE2, the control gate electrode CG2 or the gate pattern G3 is also formed. Subsequently, a wiring layer including the interlayer insulating film IL2 and the wiring M1 is formed on the interlayer insulating film IL3. In this manner, the semiconductor device of the present embodiment is substantially completed.

Next, the electrical test is performed by using the capacitor element CP in the TEG region 1C shown in FIG. 27 to measure the film thickness of the ONO film C1 (step ST28 of FIG. 21). Here, measurement is performed in the same manner as in step ST7 of FIG. 1.

Next, it is determined whether the film thickness of the ONO film C1 measured in the electrical test in step ST28 of FIG. 21 falls within the management value (step ST29 of FIG. 21). If the film thickness of the ONO film C1 fails to fall within the management value, this result is fed back to step ST24 of FIG. 21 to adjust the condition for forming the ONO film C1 (step ST31 of FIG. 1). In addition, the semiconductor wafer WF (see FIG. 2) having failed the test is discarded. By managing and correcting the film thickness of the ONO film C1 in this manner, characteristics of the memory cell MC2 shown in FIG. 27 can be improved, whereby performance of the semiconductor device can be improved. Further, reliability and manufacturing yield of the semiconductor device can also be improved.

If the result of capacitance management value determination in step ST29 of FIG. 21 is "pass", a further test is performed on the semiconductor wafer WF (step ST30 of FIG. 21). In the wafer test, a test is performed on whether the semiconductor device is able to operate normally.

Thereafter, the dicing process is performed on the semiconductor wafer WF having passed the wafer test. In this manner, a plurality of semiconductor chips CHP (see FIG. 16) can be obtained from the semiconductor wafer WF. At this time, there may be a case where the TEG region 1C remains in the scribe region 1D remaining in the peripheral portion of the semiconductor chip CHP, and it is conceivable that the capacitor element CP shown in FIG. 27 remains in the TEG region 1C.

The same effects as those of the first embodiment can be obtained in present embodiment. Namely, the memory gate electrode MG is formed in a self-aligning manner, whereby the number of photomasks can be reduced, and it is thus advantageous in that the manufacturing cost of the semiconductor device can be reduced. Further, the gate pattern G2 is formed in a step of forming the memory gate electrode MG without using a photomask, whereby the capacitor element CP can be formed without impairing this advantage.

Here, the gate pattern G2 is formed on the active region shown in FIG. 27, whereas the element isolation region EI is formed just below the gate pattern G3 beside the gate pattern G2. In this manner, it is possible to prevent capacitances CB and CC (see FIG. 36) from being unnecessarily measured via the gate pattern G3 when measuring capacitance between the gate pattern G2 and the semiconductor substrate SB in order electrically measure the film thickness of the ONO film C1 (step ST28 of FIG. 21). Thus, it is possible to accurately measure capacitance between the gate pattern G2 and the semiconductor substrate SB during the electrical test. Therefore, in the present embodiment, it is possible to measure only the film thickness of the ONO film C1 just below the gate pattern G2 which is a portion relating to characteristics of the MONOS memory, whereby it is possible to accurately evaluate by the electrical test. Namely, reliability of the semiconductor device can be improved.

In addition, in the present embodiment, the gate electrode GE2 and the control gate electrode CG2 of the transistor Q2 are formed as metal gate electrodes unlike the first embodiment, whereby resistance of each of the gate electrodes can be reduced. Thus, power consumption of the semiconductor device can be reduced.

In a case where the dummy gate electrode is replaced with the metal gate electrode by the gate-last process as in the present embodiment, a step of removing the insulating film and the like above the dummy gate electrode as described with reference to FIG. 24 and a step of removing excessive metal film and the like on the interlayer insulating film as described with reference to FIG. 26 are necessary. Thus, even if a capacitor element comprising a gate pattern located at the same height as each of the gate electrodes and an upper electrode located above the gate pattern via the ONO film is formed in the TEG region, the steps of removing the films would not allow the ONO film and the upper electrode to remain on the semiconductor substrate. In other words, in a case where the gate-last process is performed, it is difficult to form a capacitor element having overlapping gate patterns in the TEG region.

In this regard, in the present embodiment, the gate pattern G2 is formed at a position adjacent to the gate pattern G3 shown in FIG. 27, and the gate pattern G2 and the active region configure the capacitor element CP. Thus, even in a case where the semiconductor device is manufactured by using the gate-last process, the capacitor element CP for measuring film thickness can be formed in the TEG region 1C.

Third Embodiment

In a third embodiment, an example in which the present invention is applied to a semiconductor device comprising a fin structure which is a protrusion on an upper portion of the semiconductor substrate and a manufacturing method thereof will be described with reference to FIGS. 28 to 34. Note that the fins are formed in the logic circuit region and the memory cell region and are not formed in the TEG region in which the capacitor element used for measuring the film thickness of the ONO film is formed. Thus, the structure of the TEG region is the same as that of the first embodiment.

FIGS. 28 to 34 are cross-sectional views of the semiconductor device of the present embodiment in the manufacturing process. In FIGS. 28 to 34, cross sections of the logic circuit region 1A and the memory cell region 1B along a gate length direction and along a gate width direction of the transistors to be formed are each shown side-by-side. In other words, the two cross sections shown side-by-side in the logic circuit region 1A are cross sections of planes orthogonal to each other in plan view, and the two cross sections shown side-by-side in the memory cell region 1B are cross sections of planes orthogonal to each other in plan view. The cross section along the gate width direction of the logic circuit region 1A shows a cross section including a region where a gate electrode is formed in subsequent steps, and the cross section along the gate width direction of the memory cell region 1B shows a cross section including a region where a control gate electrode is formed in subsequent steps.

In addition, in FIGS. 28 to 34, some portions are not shown in the cross sections of the TEG region 1C unlike the cross-sectional views used for describing the first and second embodiments. However, configurations of elements formed in the TEG region 1C are the same as those of the first and second embodiments. Note that the silicide layer is not shown in FIG. 34.

Hereinafter, the manufacturing process of the semiconductor device will be described with reference to the flowchart shown in FIG. 1.

In the manufacturing process of the semiconductor device of the present embodiment, the same steps as those described with reference to FIGS. 2 and 3 are first performed to prepare the semiconductor wafer (semiconductor substrate) WF (step ST1 of FIG.

Figure 28:
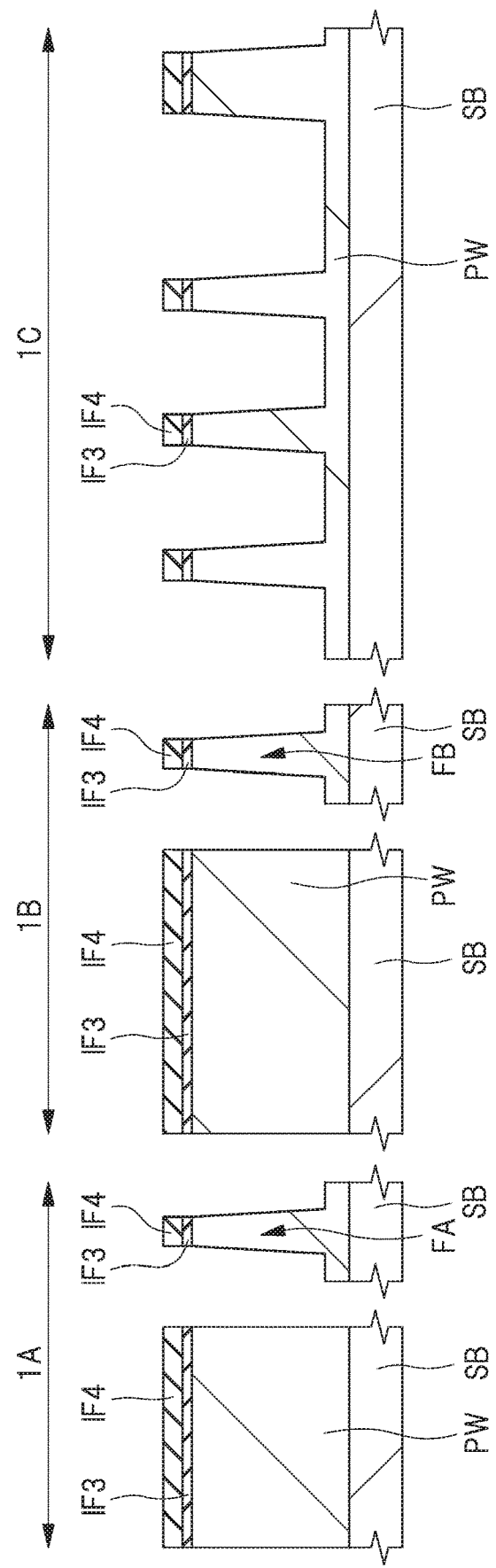
FIG. 28 is a cross-sectional view of a semiconductor device according to a third embodiment of the present invention in a manufacturing process.

Next, as shown in FIG. 28, a fin is formed on the main surface of the semiconductor substrate SB. Namely, insulating films IF3 and IF4 are formed on the semiconductor substrate SB in this order by using, for example, the CVD method or the like. The insulating film IF3 is made of, for example, a silicon oxide film, and the insulating film IF4 is made of, for example, a silicon nitride film. Subsequently, a stacked film constituted by the insulating films IF3 and IF4 is patterned by using the photolithography technique and the etching method. In the patterning process, the stacked film can be processed by using, for example, a sidewall spacer-like hard mask (not shown) formed on a side surface of a silicon film (not shown) formed on the insulating film IF4.

Here, the stacked film in each of the logic circuit region 1A and memory cell region 1B remains as a pattern extending in the X direction. In addition, the stacked film in the TEG region 1C remains as a plurality of patterns extending in the Y direction and arranged side-by-side in the X direction. The stacked film is a hard mask used to form a fin or an element isolation region.

Subsequently, dry-etching is performed with using the stacked film as a hard mask to lower the upper surface of the semiconductor substrate SB. In this manner, a plurality of trenches are formed in the upper surface of the semiconductor substrate SB. Here, a fin FA sandwiched between two trenches is formed in the logic circuit region 1A, and a fin FB sandwiched between two trenches is formed in the memory cell region 1B. Each of the fins FA and FB partially configures the semiconductor substrate SB, and is a protrusion formed below the stacked film and extending upward from the upper surface of the semiconductor substrate SB. Each of the fins FA and FB extend in the X direction, and a plurality of fins FA and FB are arranged side-by-side in the Y direction in a region not shown. In other words, a length of each of the fins FA and FB in the X direction is longer than a length in the Y direction. A plurality of trenches extending in the Y direction and arranged side-by-side in the X direction are formed in the TEG region 1C.

Figure 29:
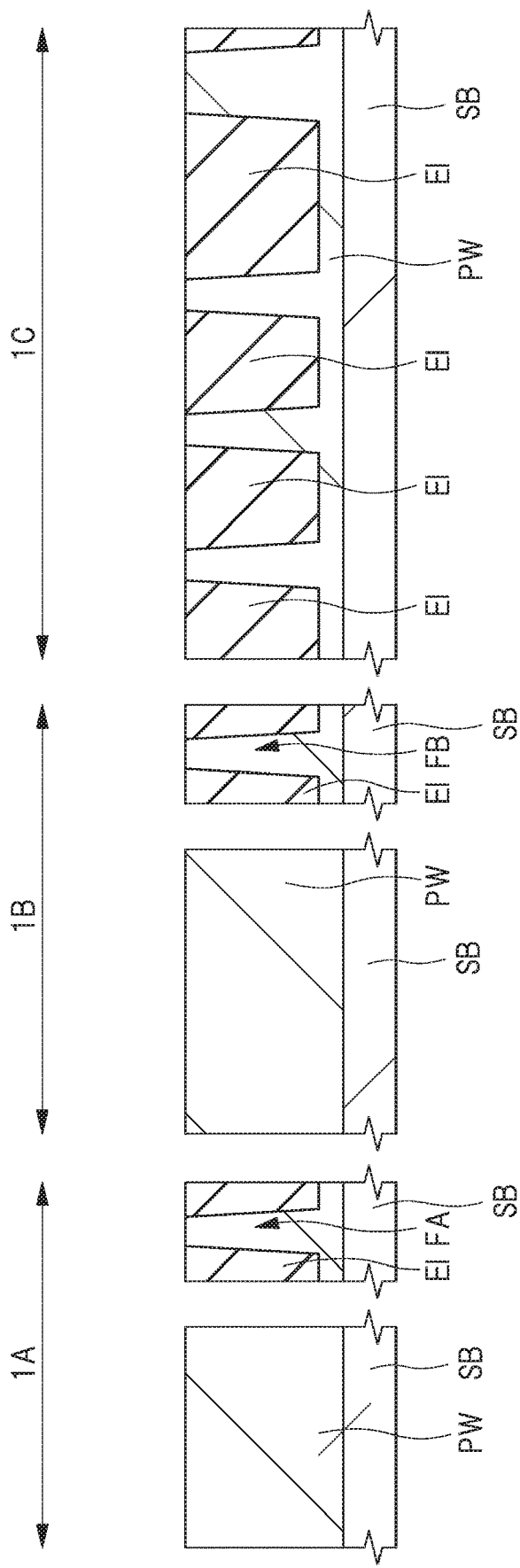
FIG. 29 is a cross-sectional view of the semiconductor device in the manufacturing process continued from FIG. 28.

Next, as shown in FIG. 29, an insulating film made of, for example, a silicon oxide film is buried in each of trenches. In this manner, the element isolation region EI made of the insulating film is formed. The element isolation region EI can be formed by depositing, for example, a silicon oxide film on the semiconductor substrate SB including each of the trenches by using, for example, the CVD method and then removing the excessive silicon oxide film above upper surfaces of the fins FA and FB by the CMP method or the like. At this time, the stacked film constituted by the insulating films IF3 and IF4 is also removed to expose the upper surface of the semiconductor substrate SB including the upper surface of each of the fins FA and FB. The plurality of the element isolation regions EI extending in the Y direction and arranged side-by-side in the X direction are formed in the TEG region 1C.

Figure 30:
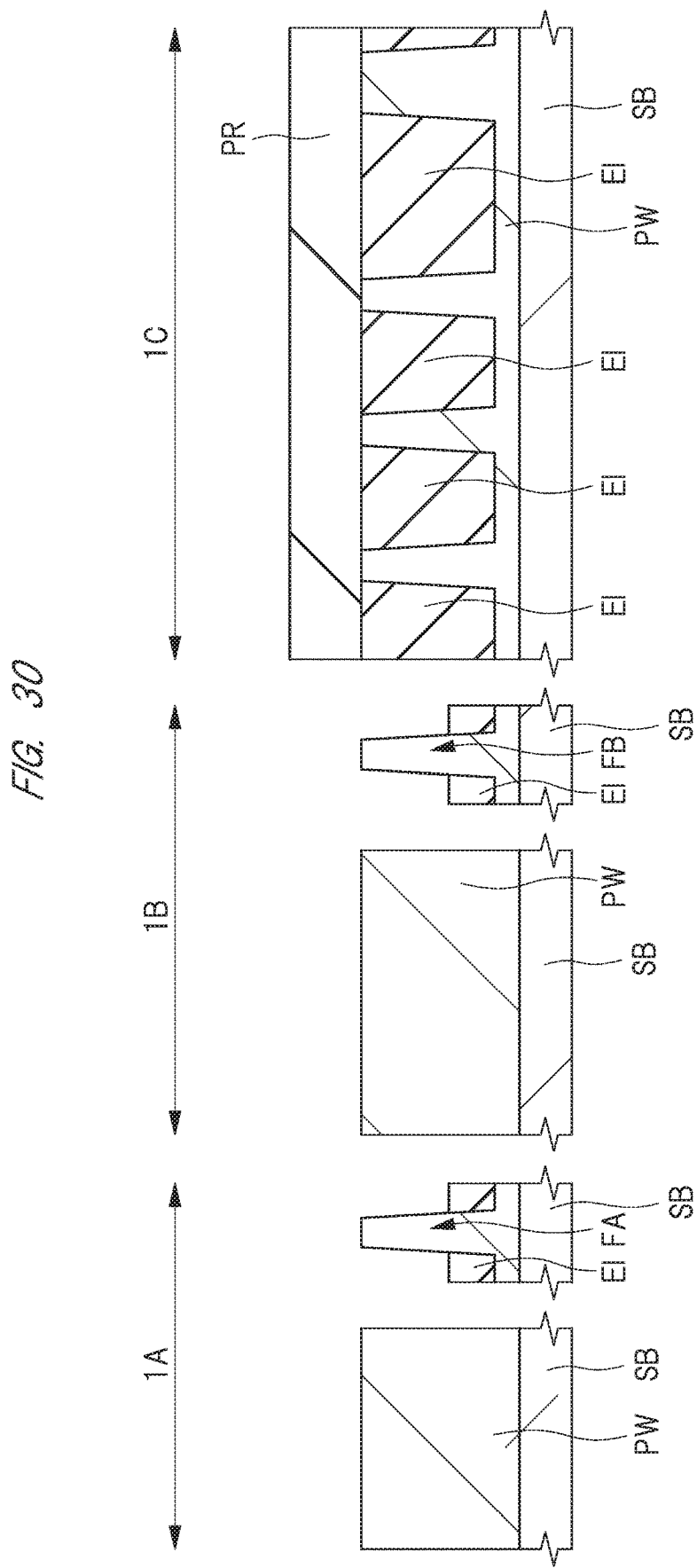
FIG. 30 is a cross-sectional view of the semiconductor device in the manufacturing process continued from FIG. 29.

Next, as shown in FIG. 30, after a photo resist film PR is formed so as to cover the semiconductor substrate SB in the TEG region 1C, dry-etching is performed to lower the upper surface of the element isolation region EI in each of the logic circuit region 1A and memory cell region 1B. In this manner, a portion of an upper portion of each of the fins FA and FB protrudes above the upper surface of the element isolation region EI. By the steps described above with reference to FIGS. 28 to 30, the element isolation region EI is formed (step ST2 of FIG. 1).

Figure 31:
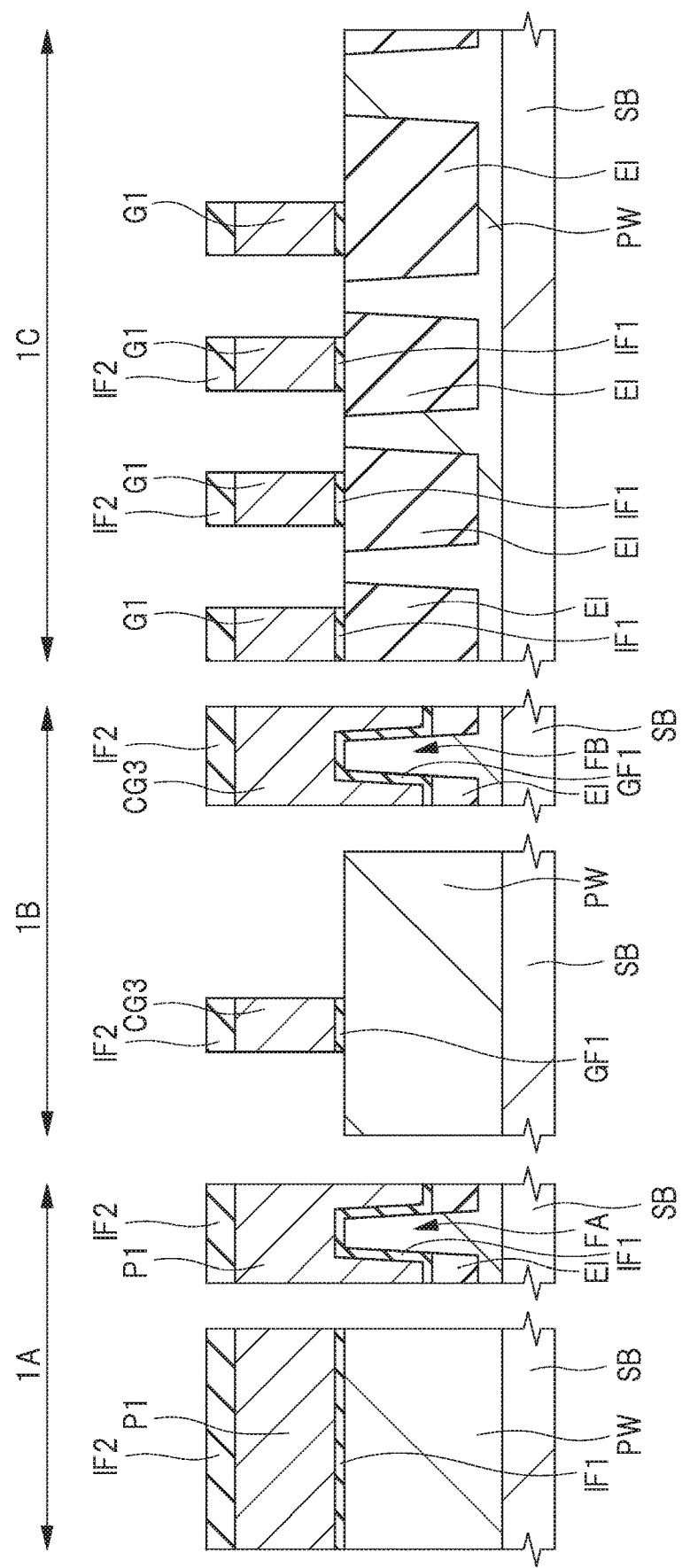
FIG. 31 is a cross-sectional view of the semiconductor device in the manufacturing process continued from FIG. 30.

Next, as shown in FIG. 31, the same steps as those described with reference to FIG. 5 are performed to form a control gate electrode CG3 and the gate pattern G1 on the semiconductor substrate SB (step ST3 of FIG. 1). Namely, in the logic circuit region 1A, the insulating film IF1, the polysilicon film P1 and the insulating film IF2 are formed so as to cover upper and side surfaces of the fin FA. In addition, in the memory cell region 1B, a stacked pattern constituted by the gate insulating film GF1, the control gate electrode CG3 and the insulating film IF2 stacked in this order is formed so as to cover upper and side surfaces of the fin FB. In other words, the control gate electrode CG3 is formed so as to cross over the fin FB. No fin is formed in the TEG region 1C, whereby a plurality of stacked patterns including the gate pattern G1 are formed side-by-side in the X direction as in the TEG region 1C of FIG. 5.

Figure 32:
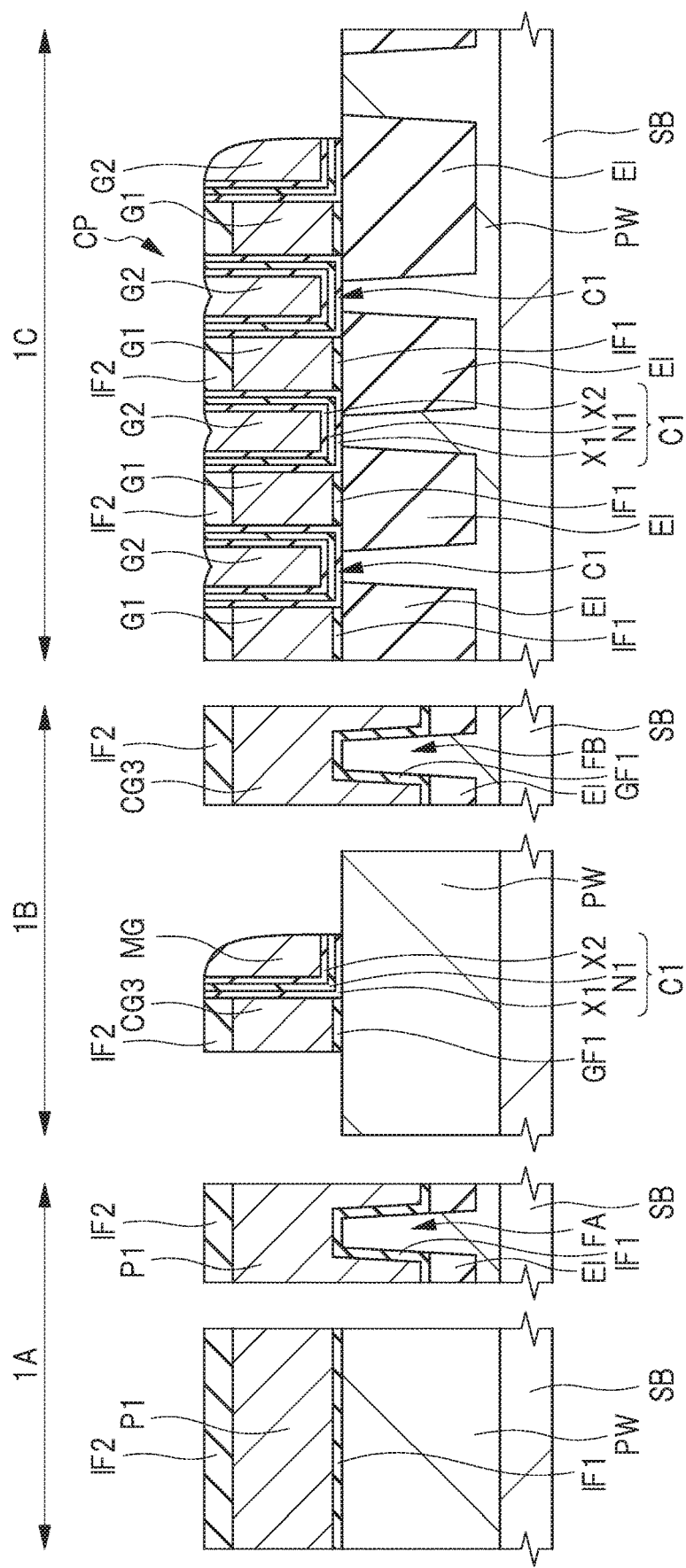
FIG. 32 is a cross-sectional view of the semiconductor device in the manufacturing process continued from FIG. 31.

Next, as shown in FIG. 32, the same steps as those described with reference to FIGS. 6 to 8 are performed to form the ONO film C1, the memory gate electrode MG and the gate pattern G2 (steps ST4 to ST5 of FIG. 1). Namely, in the memory cell region 1B, the sidewall spacer-like memory gate electrode MG is formed on one of the side surfaces in the X direction of a stacked pattern including the control gate electrode CG3 via the ONO film C1. Here, the memory gate electrode MG is formed via the ONO film C1 so as to cover the upper and side surfaces of the fin FB. In other words, the memory gate electrode MG is formed so as to cross over the fin FB. In addition, the gate pattern G2 having the same structure as that shown in FIG. 8 is formed in the TEG region 1C. In this manner, in the TEG region 1C, the capacitor element CP constituted by the gate pattern G2 and the active region is formed as in the structure shown in FIG. 8.

Figure 33:
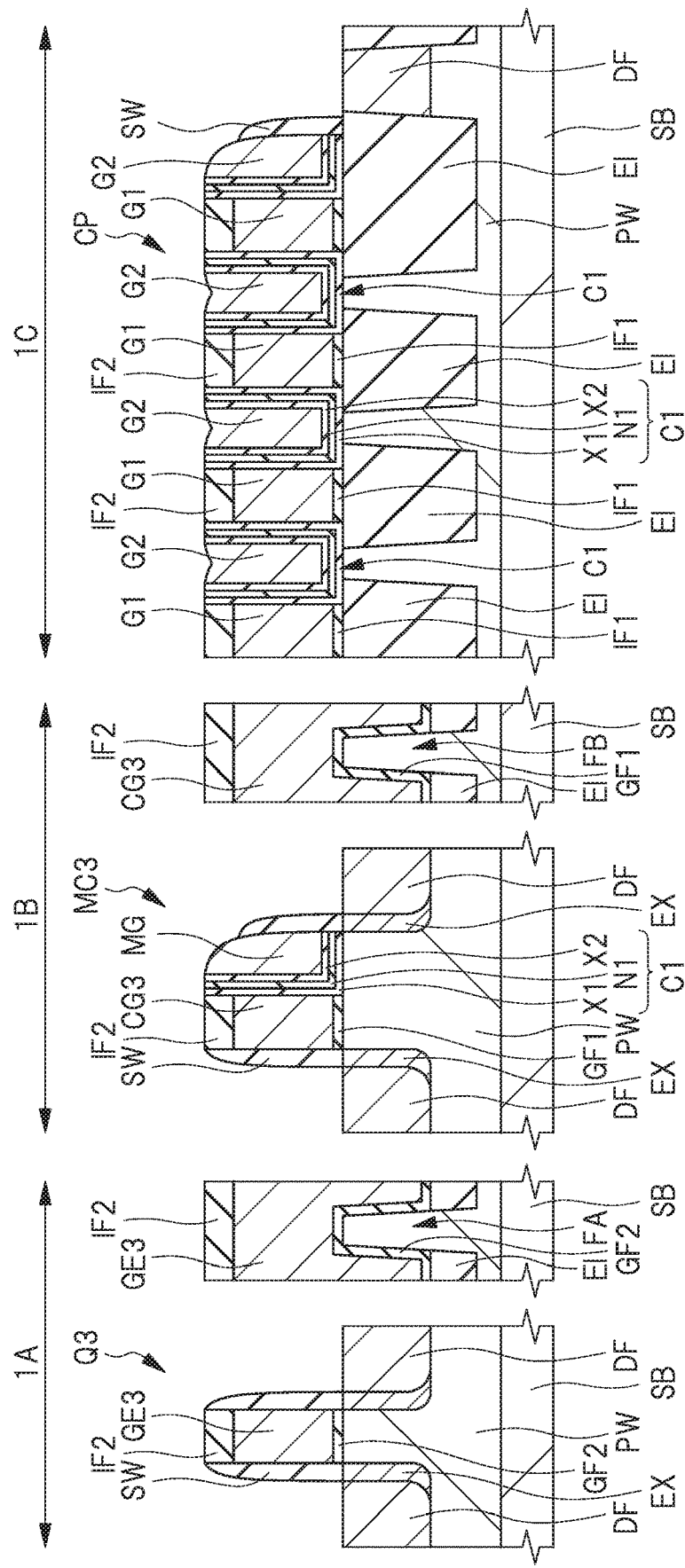
FIG. 33 is a cross-sectional view of the semiconductor device in the manufacturing process continued from FIG. 32.

Next, as shown in FIG. 33, the same steps as those described with reference to FIGS. 9 and 10 are performed to form a transistor Q3 in the logic circuit region 1A and a memory cell MC3 in the memory cell region 1B. Namely, in the logic circuit region 1A, a stacked pattern constituted by the gate insulating film GF2, a gate electrode GE3 and the insulating film IF2 stacked in this order is formed so as to cover the upper and side surfaces of the fin FA, and the source/drain regions constituted by the extension region EX and the diffusion region DF formed in the fin FA are formed. In other words, the gate electrode GE3 is formed so as to cross over the fin FA.

Here, each of the extension region EX and diffusion region DF is formed in the fin FA so as to extend from the upper surface of the fin FA to the upper surface of the element isolation region EI and has the same depth as each another. In addition, each of the extension region EX and diffusion region DF is formed in a side surface of the fin FA. Likewise, in the memory cell region 1B, source/drain regions constituted by the extension region EX and the diffusion region DF are formed in the fin FB. In addition, in the TEG region 1C, the diffusion region DF is formed in the upper surface of the active region exposed from the gate patterns G1 and G2.

The transistor Q3 comprises the gate electrode GE3 and the source/drain regions, and is an element having upper and side surfaces of the fin FA serving as a channel region. Likewise, the memory cell MC3 in the memory cell region 1B has upper and side surfaces of the fin FB serving as a channel region. The transistor Q3, the control transistor and the memory transistor having a channel in upper and side surfaces of each of the fins FA and FB have a larger gate width than a transistor having a channel only in the flat upper surface of the semiconductor substrate SB, whereby the semiconductor device can be easily miniaturized.

Figure 34:
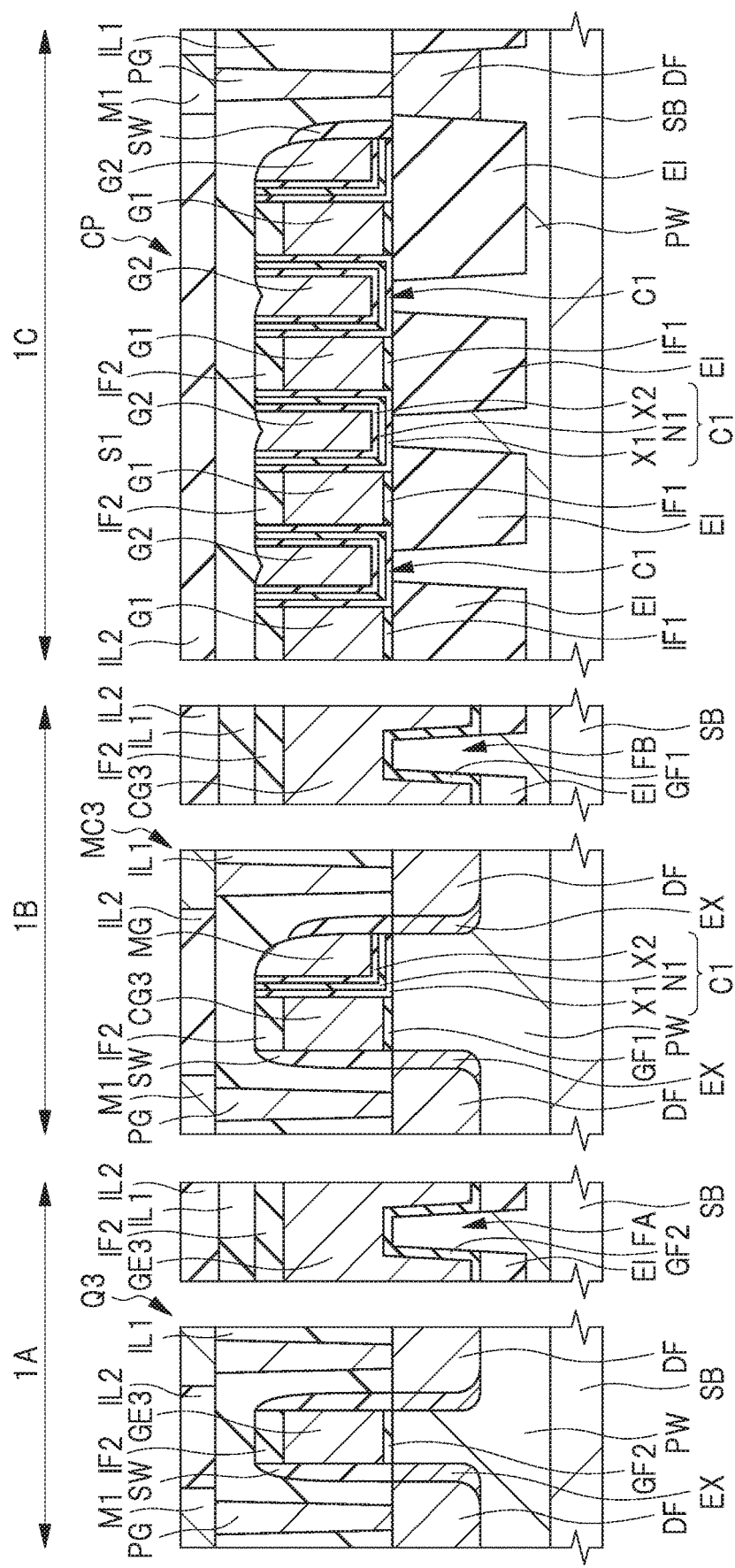
FIG. 34 is a cross-sectional view of the semiconductor device in the manufacturing process continued from FIG. 33.

Next, as shown in FIG. 34, the same steps as those described with reference to FIGS. 12 to 15 are performed to form the interlayer insulating film IL1, the plug PG, the interlayer insulating film IL2 and the wiring M1. By forming the wiring layer in this manner, (step ST6 of FIG. 1), the semiconductor device of the present embodiment is substantially completed. Here, descriptions of the step of forming a silicide layer have been omitted. However, a silicide layer may be formed on the upper surface of each of the gate electrodes and source/drain regions as in the first embodiment. In this case, after the sidewall spacer covering the side surface of each of the gate electrodes is formed, an epitaxial growth layer may be formed on the surface of the fin exposed from the sidewall spacer and the like, and a silicide layer may be formed on a surface of the epitaxial growth layer.

Next, the electrical test is performed by using the capacitor element CP in the TEG region 1C shown in FIG. 34 to measure the film thickness of the ONO film C1 (step ST7 of FIG. 1). Here, measurement is performed in the same manner as in step ST7 of FIG. 1.

Next, it is determined whether the film thickness of the ONO film C1 measured in the electrical test in step ST7 of FIG. 1 falls within the management value (step ST8 of FIG. 1). If the film thickness of the ONO film C1 fails to fall within the management value, this result is fed back to step ST4 of FIG. 1 to adjust the condition for forming the ONO film C1 (step ST10 of FIG. 1). In addition, the semiconductor wafer WF (see FIG. 2) having failed the test is discarded. By managing and correcting the film thickness of the ONO film C1 in this manner, characteristics of the memory cell MC3 shown in FIG. 34 can be improved, whereby performance of the semiconductor device can be improved. Further, reliability and manufacturing yield of the semiconductor device can also be improved.

If the result of capacitance management value determination in step ST8 of FIG. 1 is "pass", a further test is performed on the semiconductor wafer WF (step ST9 of FIG. 1). In the wafer test, a test is performed on whether the semiconductor device is able to operate normally.

Thereafter, the dicing process is performed on the semiconductor wafer WF having passed the wafer test. In this manner, a plurality of semiconductor chips CHP (see FIG. 16) can be obtained from the semiconductor wafer WF. At this time, there may be a case where the TEG region 1C remains in the scribe region 1D remaining in the peripheral portion of the semiconductor chip CHP, and it is conceivable that the capacitor element CP shown in FIG. 34 remains in the TEG region 1C.

The same effects as those of the first embodiment can be obtained in the present embodiment. Namely, the memory gate electrode MG is formed in a self-aligning manner, whereby the number of photomasks can be reduced, and it is thus advantageous in that the manufacturing cost of the semiconductor device can be reduced. Further, the gate pattern G2 is formed in the step of forming the memory gate electrode MG without using a photomask, whereby the capacitor element CP can be formed without impairing this advantage.

Here, the gate pattern G2 is formed in the active region shown in FIG. 34, whereas the element isolation region EI is formed just below the gate pattern G1 beside the gate pattern G2. In this manner, it is possible to prevent capacitances CB and CC (see FIG. 36) from being unnecessarily measured via the gate pattern G1 when measuring capacitance between the gate pattern G2 and the semiconductor substrate SB in order to electrically measure the film thickness of the ONO film C1 (step ST7 of FIG. 1). Thus, it is possible to accurately measure capacitance between the gate pattern G2 and the semiconductor substrate SB during the electrical test. Therefore, in the present embodiment, it is possible to measure only the film thickness of the ONO film C1 just below the gate pattern G2 which is a portion relating to characteristics of the MONOS memory, whereby it is possible to accurately evaluate by the electrical test. Namely, reliability of the semiconductor device can be improved.

In addition, in a case where the capacitor element which is a TEG is formed on the fin, the film thickness of the ONO film is affected by coverage characteristics of the side surface of the fin, the depth of the fin or the like, and is likely to vary. Here, "coverage characteristics" refers to coverage of the film covering a three-dimensional pattern such as the fin. In other words, even if the film thickness of the film covering the upper surface of the three-dimensional pattern is constant, the film thickness of the film covering the side surface of the three-dimensional pattern is not constant, and the film thickness is likely to become thinner from, for example, the upper side to the lower side of the side surface. In addition, if the depth of the fin varies, the capacitance between the upper electrode and the lower electrode of the capacitor element would also vary.

In this regard, in the present embodiment, no fin is formed in the TEG region 1C, and the gate patterns G1 and G2 and the ONO film C1 are formed on the flat upper surface of the semiconductor substrate SB. Thus, the film thickness of the ONO film C1 can be accurately measured without being affected by the coverage characteristics of the side surface of the fin, the depth of the fin or the like.

In the foregoing, the invention made by the present inventors has been concretely described based on the embodiments. However, it is needless to say that the present invention is not limited to the foregoing embodiments and various modifications can be made within the scope of the present invention.

For example, the foregoing embodiments has described an example in which an n-channel type transistor is formed in the logic circuit region, and an n-channel type control transistor and an n-channel type memory transistor are formed in the memory cell region. However, the conductivity type of these transistors may be of a p-channel type. In this case, impurities to be implanted into the semiconductor regions such as the well and source/drain regions are changed, and these semiconductor regions are formed with their conductivity types reversed.

In addition, the modification example of the first embodiment may be applied to a case where the gate-last process of the second embodiment is performed or to a case where the transistor having a fin structure of the third embodiment is formed. In addition, the gate-last process of the second embodiment may be applied to the transistor having the fin structure of the third embodiment.

In addition, in the first to third embodiments, the ONO film is described as a film in which a silicon oxide film, a silicon nitride film and a silicon oxide film are stacked in this order. However, the ONO film may be a film in which, for example, a silicon oxide film, a hafnium oxide film (charge storage film) and an aluminum oxide film are stacked over the semiconductor substrate in this order.

In addition, in the first to third embodiments, a case where the gate length direction of the transistor in each of the logic circuit region and memory cell region and a direction in which the gate patterns in the TEG region are aligned are all in the X direction has been described by way of example. However, these directions do not need to be in the same direction and may differ between each element.

What is claimed is:

1. A semiconductor device comprising:
    a semiconductor substrate including a first region and a second region different from the first region;
    a control gate electrode formed on an upper surface of the first region of the semiconductor substrate via a first insulating film;
    a memory gate electrode formed on the upper surface of the semiconductor substrate via a second insulating film including a first charge storage film, the memory gate electrode being adjacent to the control gate electrode via the second insulating film;
    a source/drain region formed in the upper surface of the semiconductor substrate, the source/drain region being formed beside a pattern including the control gate electrode and the memory gate electrode;
    a plurality of element isolation regions buried in an upper surface in the second region of the semiconductor substrate;
    an active region being a portion of the upper surface of the semiconductor substrate, the active region exposed from the element isolation region;
    a plurality of first gate patterns formed above the plurality of element isolation regions, respectively, such that the plurality of first gate patterns and the plurality of element isolation regions are respectively arranged side-by-side in a first direction along the upper surface of the semiconductor substrate; and
    a second gate pattern buried between the plurality of first gate patterns adjacent to each other in the first direction such that the second gate pattern is formed adjacent to side surfaces of the plurality of first gate patterns adjacent to each other in the first direction via a third insulating film including a second charge storage film, the second gate pattern being located above the active region via the third insulating film,
    wherein the control gate electrode, the memory gate electrode and the source/drain region configure a memory cell, and
    wherein the second gate pattern, the third insulating film and the active region in the second region configure a capacitor element.

2. The semiconductor device according to claim 1, wherein the plurality of first gate patterns is spaced apart from the active region in plan view.

3. The semiconductor device according to claim 1,
    wherein the control gate electrode is formed of a first metal film,
    wherein the memory gate electrode is formed of a first semiconductor film,
    wherein the first gate pattern is formed of a second metal film, and
    wherein the second gate pattern is formed of a second semiconductor film.

4. The semiconductor device according to claim 1, further comprising:
a protrusion formed on the upper surface of the semiconductor substrate and extending in a second direction along the upper surface of the semiconductor substrate, wherein the memory cell is formed on the protrusion.

5. The semiconductor device according to claim 1, wherein the capacitor element is used to measure a thickness of the first insulating film.

* * * * *